US011942551B2

(12) United States Patent
Kim et al.

(10) Patent No.: US 11,942,551 B2
(45) Date of Patent: Mar. 26, 2024

(54) SEMICONDUCTOR DEVICES

(71) Applicant: Samsung Electronics Co., Ltd., Suwon-si (KR)

(72) Inventors: Jung Taek Kim, Yongin-si (KR); Seok Hoon Kim, Suwon-si (KR); Pan Kwi Park, Incheon (KR); Moon Seung Yang, Hwaseong-si (KR); Seo Jin Jeong, Incheon (KR); Min-Hee Choi, Suwon-si (KR); Ryong Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 63 days.

(21) Appl. No.: 17/519,967

(22) Filed: Nov. 5, 2021

(65) Prior Publication Data

US 2022/0190168 A1 Jun. 16, 2022

(30) Foreign Application Priority Data

Dec. 10, 2020 (KR) ........................ 10-2020-0172433

(51) Int. Cl.
*H01L 29/786* (2006.01)
*H01L 29/06* (2006.01)
*H01L 29/423* (2006.01)

(52) U.S. Cl.
CPC .... *H01L 29/78618* (2013.01); *H01L 29/0665* (2013.01); *H01L 29/42392* (2013.01); *H01L 29/78696* (2013.01)

(58) Field of Classification Search
CPC ...... H01L 27/1211; H01L 21/823418–823425; H01L 29/0843–0891; H01L 29/66636–66643; H01L 21/823814; H01L 29/66575–66598; H01L 29/66515; H01L 29/41783; H01L 29/78618; H01L 29/0665; H01L 29/42392; H01L 29/78696; H01L 29/41766; H01L 29/165; H01L 29/0673; H01L 29/42376; H01L 29/775;
(Continued)

(56) References Cited

U.S. PATENT DOCUMENTS 10,535,735 B2  1/2020  Glass et al.
10,720,530 B2  7/2020  Ma et al.
(Continued)

FOREIGN PATENT DOCUMENTS

KR    20190111618 A    10/2019

*Primary Examiner* — Jonathan Han
(74) *Attorney, Agent, or Firm* — Myers Bigel, P.A.

(57) ABSTRACT

A semiconductor device includes a multi-channel active pattern, a plurality of gate structures on the multi-channel active pattern and spaced apart from each other in a first direction, the plurality of gate structures including a gate electrode that extends in a second direction different from the first direction, a source/drain recess between the adjacent gate structures, and a source/drain pattern on the multi-channel active pattern in the source/drain recess, wherein the source/drain pattern includes: a semiconductor liner layer including silicon-germanium and extending along the source/drain recess, a semiconductor filling layer including silicon-germanium on the semiconductor liner layer, and at least one or more semiconductor insertion layers between the semiconductor liner layer and the semiconductor filling layer, and wherein the at least one or more semiconductor insertion layers have a saddle structure.

20 Claims, 28 Drawing Sheets

(58) Field of Classification Search
CPC ............ H01L 29/0847; H01L 29/1033; H01L 29/41725; H01L 29/42356; H01L 29/42364; H01L 29/7831; H01L 21/82342; H01L 21/823412; H01L 21/823462; H01L 21/823468; H01L 29/66787; H01L 29/0669–068; H01L 2924/13061; H01L 29/66439; H01L 29/66469; H01L 29/78687; H01L 29/122–127; H01L 29/15–158; H01L 29/0856–0869; H01L 21/823807; H01L 29/66492; H01L 29/7833–7836; H01L 2029/7863; H01L 29/78621–78627; H01L 29/66659; H01L 29/7835; H01L 29/78624; H01L 29/1041–1045; H01L 29/66537; H01L 29/0873–0886; H01L 21/823431; H01L 21/823821; H01L 21/845; H01L 27/0886; H01L 27/0924; H01L 29/78; H01L 29/08; H01L 29/66; H01L 21/02; H01L 21/8238; H01L 27/092; H01L 29/06; H01L 21/225; H01L 21/3065; H01L 21/8234; H01L 27/088; H01L 29/417; H01L 29/423; H01L 21/265; H01L 21/268; H01L 21/285; H01L 21/311; H01L 21/764; H01L 21/82; H01L 29/10; H01L 29/161; H01L 29/167; H01L 29/40; H01L 29/49; H01L 29/786; H10B 12/056; H10B 12/36; Y10S 977/938

See application file for complete search history.

(56) References Cited

U.S. PATENT DOCUMENTS

| | | |
|---|---|---|
| 10,741,677 B2 | 8/2020 | Li et al. |
| 2018/0138269 A1* | 5/2018 | Kim .................... H01L 21/0257 |
| 2019/0096884 A1 | 3/2019 | Lu et al. |
| 2019/0273159 A1* | 9/2019 | Lee ........................ H01L 29/20 |
| 2020/0044025 A1 | 2/2020 | Liu et al. |
| 2020/0075724 A1 | 3/2020 | Wang et al. |
| 2020/0168723 A1 | 5/2020 | Hsu et al. |
| 2021/0082914 A1 | 3/2021 | Lee et al. |
| 2022/0037520 A1* | 2/2022 | More ................ H01L 29/66545 |
| 2022/0052203 A1* | 2/2022 | More ................ H01L 29/66553 |
| 2022/0069135 A1* | 3/2022 | Chu ...................... H01L 29/775 |

* cited by examiner

SEMICONDUCTOR DEVICES

CROSS-REFERENCE TO RELATED APPLICATION

This application claims priority from Korean Patent Application No. 10-2020-0172433 filed on Dec. 10, 2020 in the Korean Intellectual Property Office, the disclosure of which is incorporated herein by reference in its entirety.

BACKGROUND

1. Field of the Disclosure

The present disclosure relates to a semiconductor device.

2. Description of the Related Art

As one of the scaling techniques for increasing the degree of integration of a semiconductor device, multi-gate transistors have been proposed in which a multi-channel active pattern (or a silicon body) having a fin or nanowire shape is formed on a substrate and a gate is formed on a surface of the multi-channel active pattern.

The multi-gate transistor utilizes a three-dimensional (3D) channel and thus it is easy to scale. In addition, current control capability may be improved without increasing a gate length of the multi-gate transistor. Further, the short channel effect (SCE), which is a phenomenon in which the electric potential of a channel region is affected by a drain voltage, may be effectively suppressed.

SUMMARY

Aspects of the present disclosure provide a semiconductor device capable of improving the performance and reliability of a device.

It should be noted that objects of the present disclosure are not limited to the above-described objects, and other objects of the present disclosure will be apparent to those skilled in the art from the following descriptions.

According to some aspects of the present disclosure, there is provided a semiconductor device comprising a multi-channel active pattern, a plurality of gate structures on the multi-channel active pattern and spaced apart from each other in a first direction, the gate structures including a gate electrode that extend in a second direction different from the first direction, a source/drain recess between the adjacent gate structures, and a source/drain pattern on the multi-channel active pattern in the source/drain recess, wherein the source/drain pattern includes: a semiconductor liner layer including silicon-germanium and extending along the source/drain recess, a semiconductor filling layer including silicon-germanium on the semiconductor liner layer, and at least one or more semiconductor insertion layers between the semiconductor liner layer and the semiconductor filling layer, and wherein the at least one or more semiconductor insertion layers have a saddle structure.

According to some aspects of the present disclosure, there is provided a semiconductor device comprising an active pattern including a lower pattern extending in a first direction and a plurality of sheet patterns spaced apart from the lower pattern in a second direction perpendicular to the first direction, a plurality of gate structures on the lower pattern to be spaced apart from each other in the first direction and including a gate electrode and a gate insulating layer, the gate electrode and the gate insulating layer surrounding the plurality of sheet patterns, a source/drain recess between the adjacent gate structures, and a source/drain pattern on the lower pattern in the source/drain recess and being in contact with the sheet pattern, wherein the source/drain pattern includes: a semiconductor liner layer that extends along the source/drain recess, is in contact with the gate insulating layer, and includes silicon-germanium, a first semiconductor insertion layer on the semiconductor liner layer, a semiconductor filling layer including silicon-germanium on the first semiconductor insertion layer, and a semiconductor capping layer including silicon on the semiconductor filling layer, and wherein a germanium fraction of the first semiconductor insertion layer is less than a germanium fraction of the semiconductor liner layer and a germanium fraction of the semiconductor filling layer.

According to some aspects of the present disclosure, there is provided a semiconductor device comprising an active pattern including a lower pattern, and a sheet pattern spaced apart from the lower pattern in a first direction, a gate structure on the lower pattern and including a gate electrode and a gate insulating layer surrounding the sheet pattern, the gate electrode extending in a second direction perpendicular to the first direction, and a source/drain pattern on the lower pattern and in contact with the gate insulating layer, wherein the source/drain pattern includes: a semiconductor liner layer including an outer sidewall in contact with the gate insulating layer and an inner sidewall opposite to the outer sidewall, a first semiconductor insertion layer in contact with the semiconductor liner layer on the inner sidewall of the semiconductor liner layer, a second semiconductor insertion layer on the first semiconductor insertion layer, and a semiconductor filling layer on the second semiconductor insertion layer, and wherein the first semiconductor insertion layer covers at least a portion of the inner sidewall of the semiconductor liner layer, the second semiconductor insertion layer extends along at least a portion of a profile of the first semiconductor insertion layer, a germanium fraction of the first semiconductor insertion layer is greater than a germanium fraction of the semiconductor liner layer and is less than a germanium fraction of the semiconductor filling layer, and a germanium fraction of the second semiconductor insertion layer is less than the germanium fraction of the semiconductor liner layer and the germanium fraction of the first semiconductor insertion layer.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION

Figure 1:
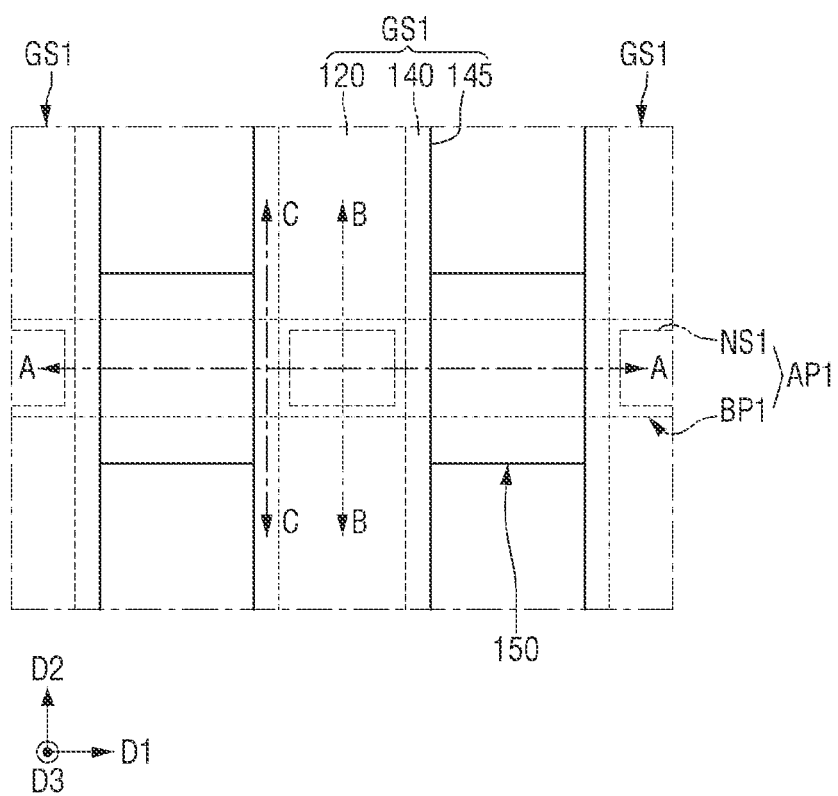
FIG. 1 is an exemplary plan view for describing a semiconductor device according to some exemplary embodiments.

In the drawings of a semiconductor device according to some exemplary embodiments, a transistor including nanowires or nano-sheets, a multi-bridge channel field-effect transistor (MBCFET™), and a fin-shaped field-effect transistor (FinFET) including a channel region having a fin-shaped pattern are illustratively shown, but the present disclosure is not limited thereto.

The semiconductor device according to some exemplary embodiments may include a tunneling field-effect transistor (tunneling FET), a three-dimensional (3D) transistor, or a two-dimensional (2D) material-based transistor (2D material-based FET), and a heterostructure thereof. In addition, the semiconductor device according to some example exemplary embodiments may also include a bipolar junction transistor, a laterally-diffused metal-oxide semiconductor (LDMOS) transistor, or the like.

Referring to FIGS. 1 to 12, a semiconductor device according to some exemplary embodiments will be described.

Figure 2:
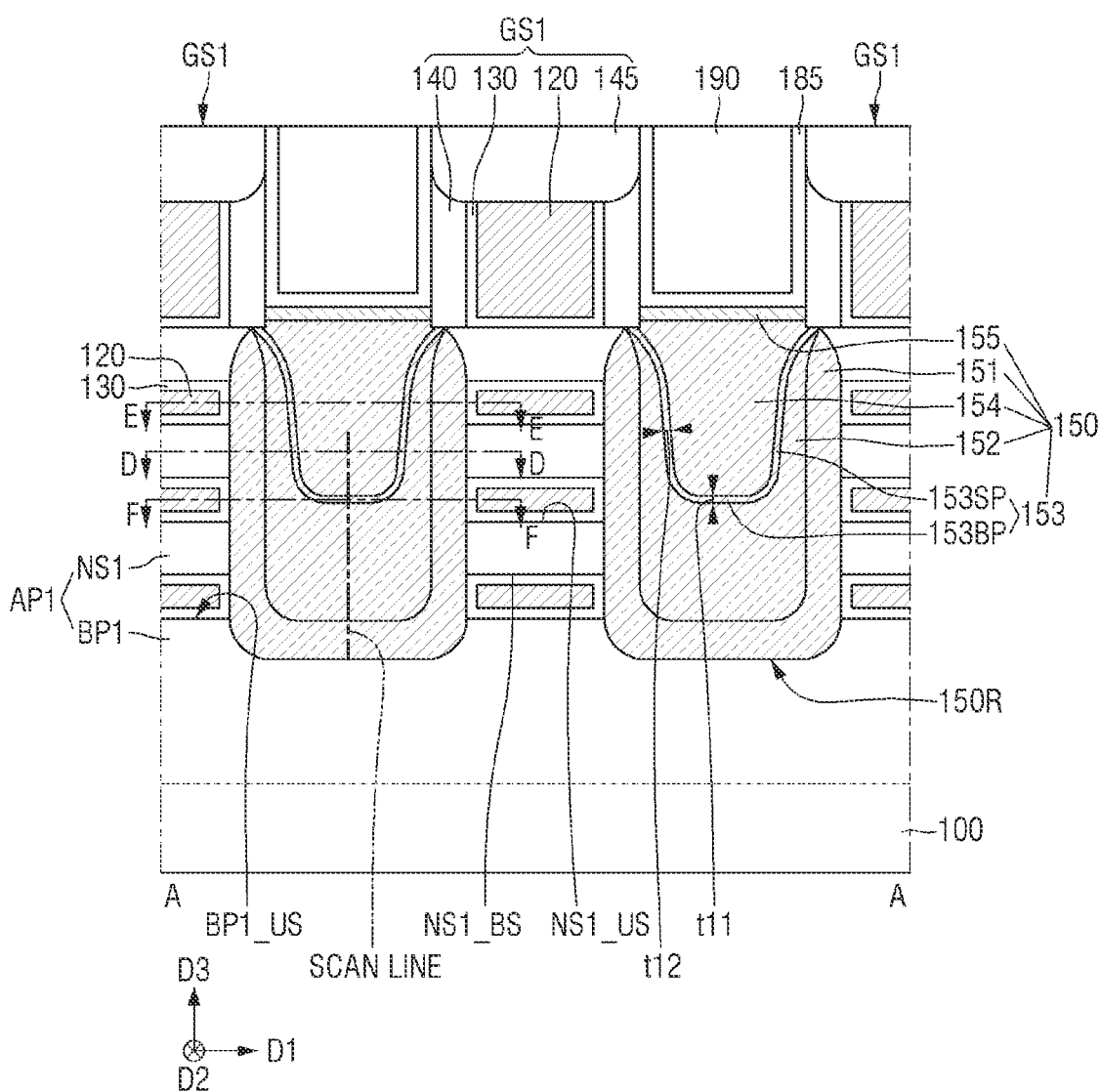
FIGS. 2 to 4 are cross-sectional views taken along lines A-A, B-B, and C-C of FIG. 1, respectively.
Figure 3:
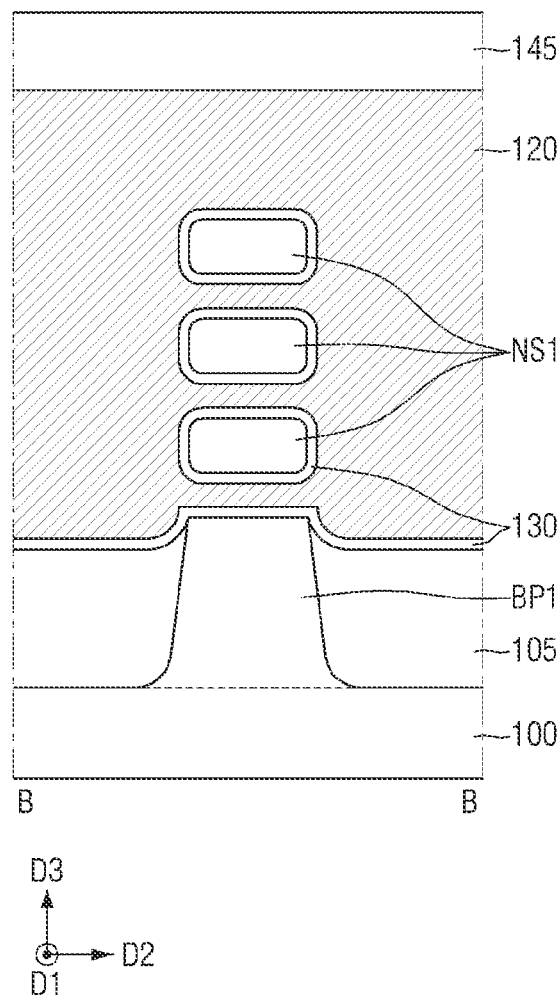
Figure 4:
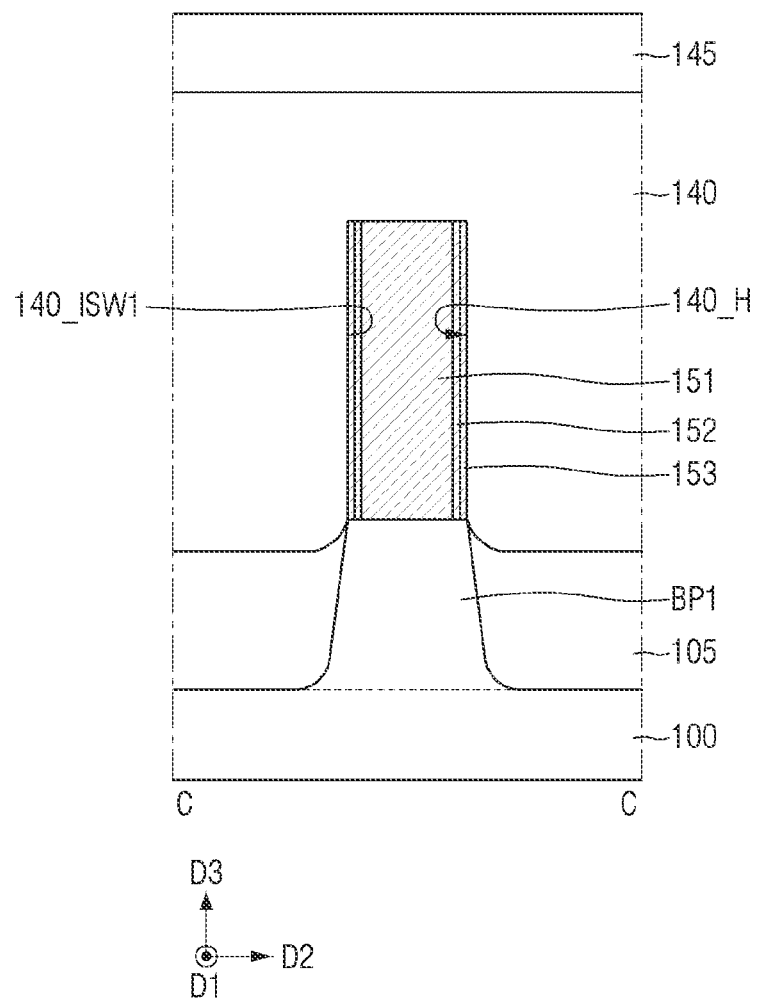
Figure 5:
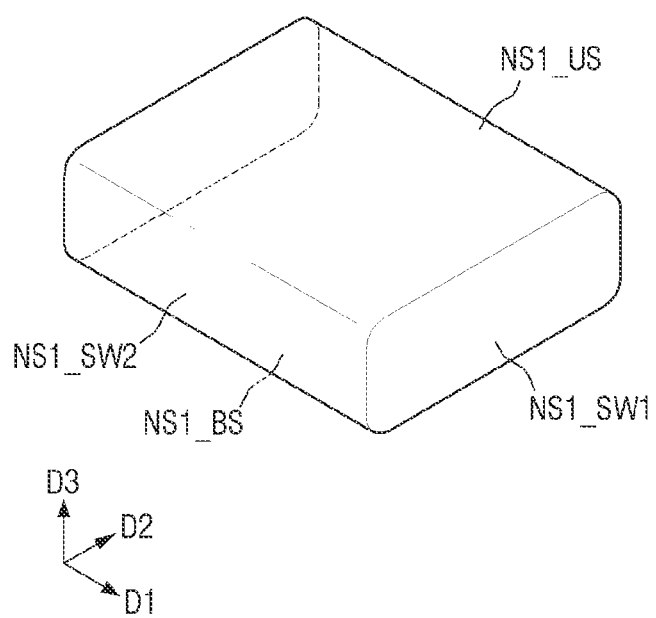
FIG. 5 is a view for describing a shape of a first sheet pattern of FIG. 2.
Figure 6:
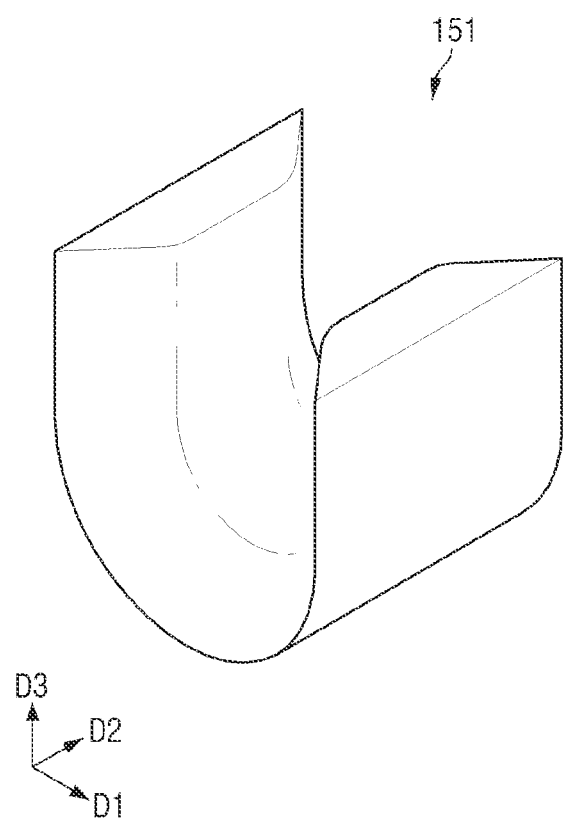
FIG. 6 is an exemplary view for describing a three-dimensional shape of a semiconductor liner layer of FIG. 2.
Figure 7:
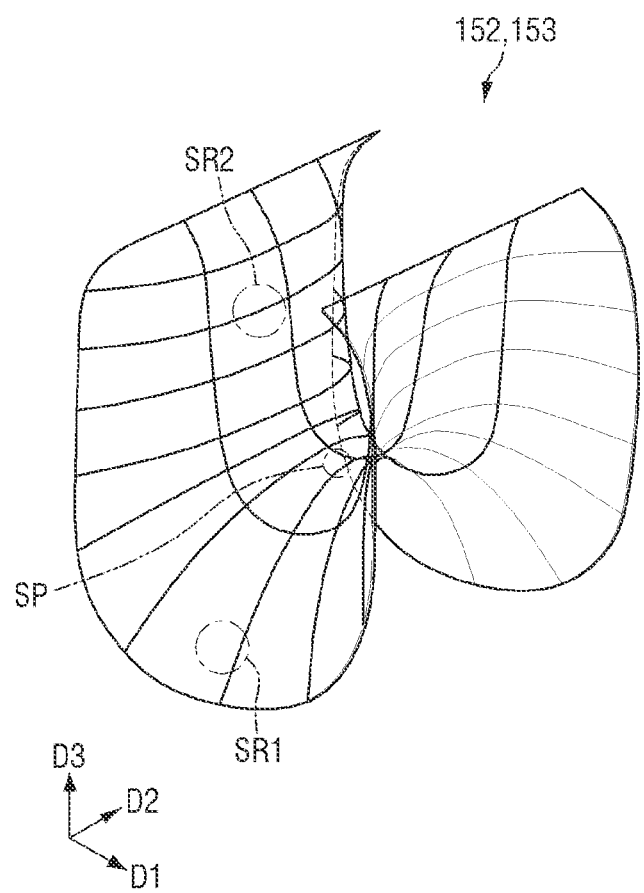
FIG. 7 is an exemplary view for describing a three-dimensional shape of each of a lower semiconductor insertion layer and an upper semiconductor insertion layer of FIG. 2.
Figure 8:
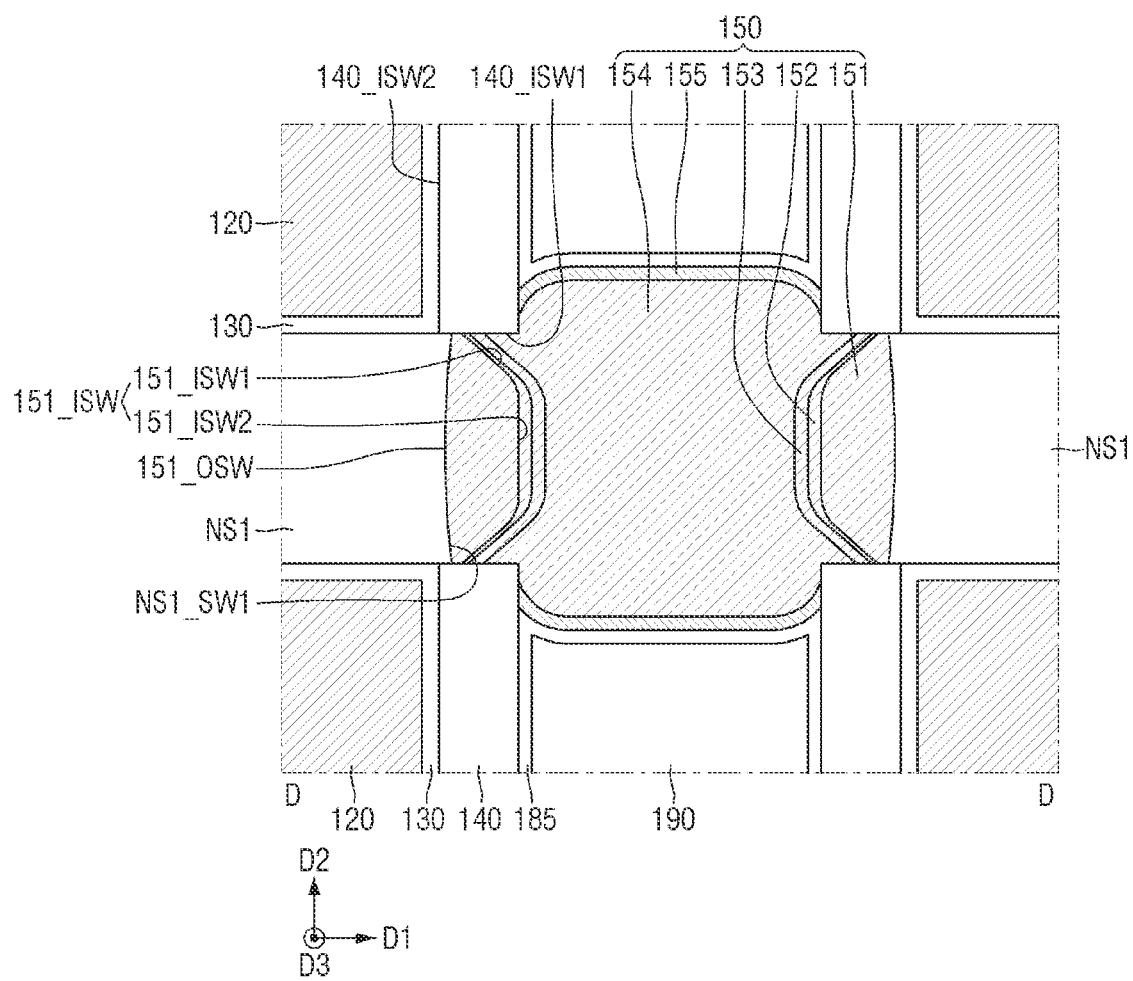
FIGS. 8 and 9 are cross-sectional views taken along lines D-D and E-E of FIG. 2, respectively.
Figure 9:
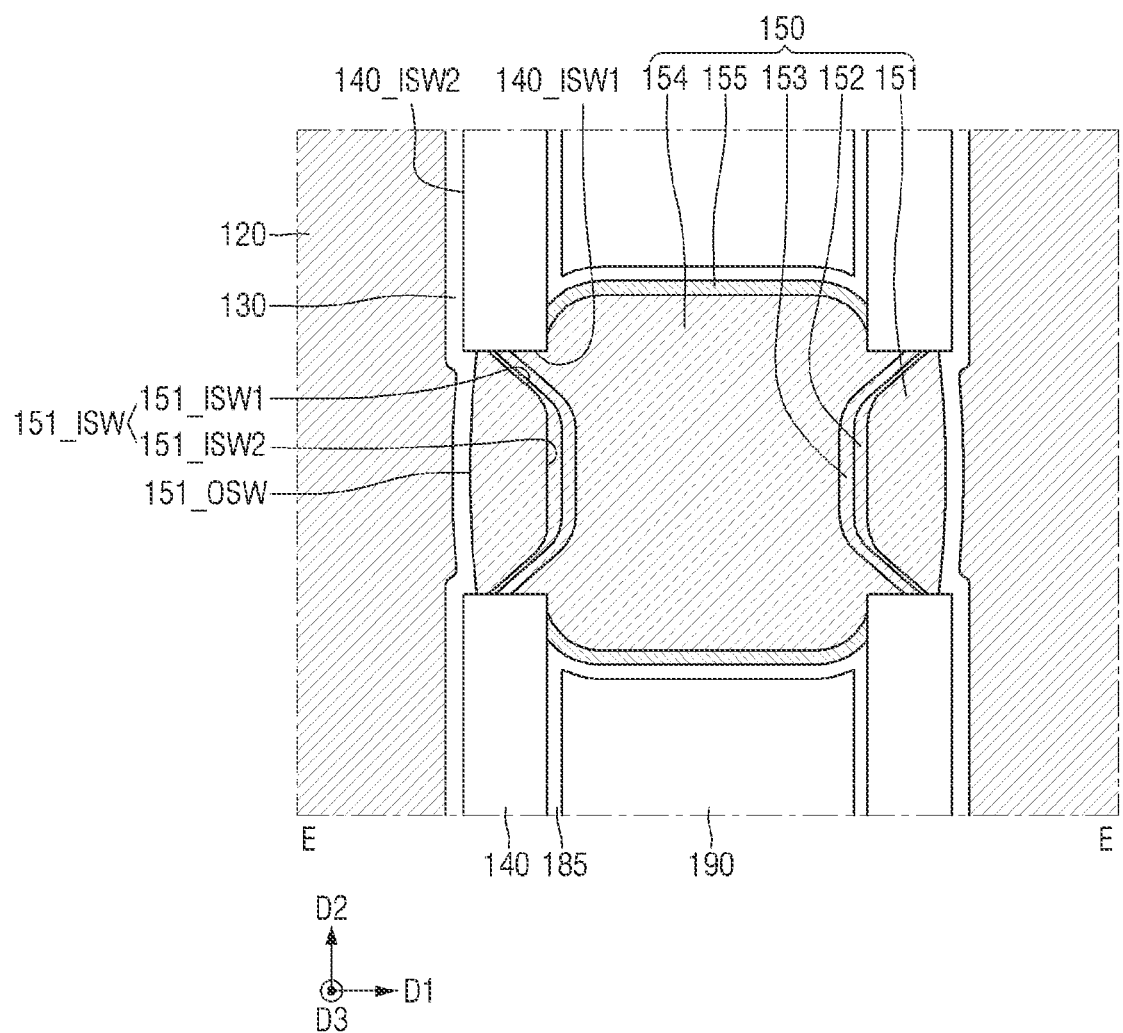
Figure 11:
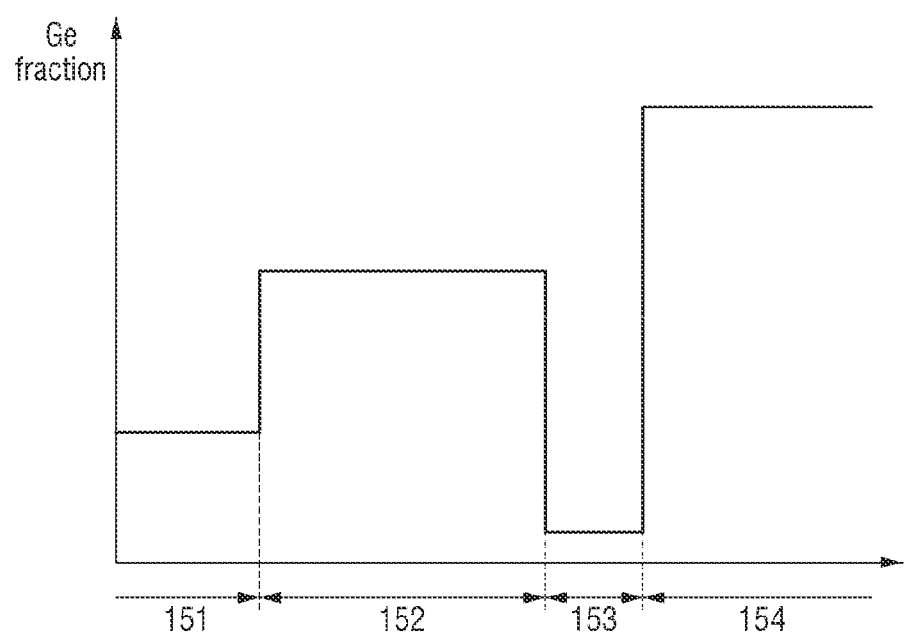
FIGS. 11 and 12 are schematic views illustrating a germanium fraction along a scan line of FIG. 2.
Figure 12:
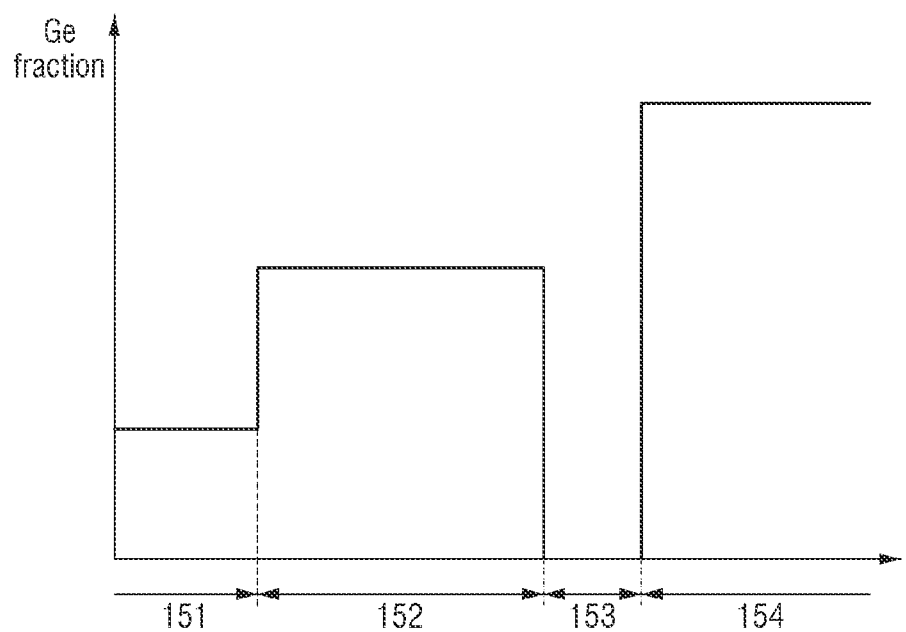

FIG. 1 is an exemplary plan view for describing the semiconductor device according to some exemplary embodiments. FIGS. 2 to 4 are cross-sectional views taken along lines A-A, B-B, and C-C of FIG. 1, respectively. FIG. 5 is a view for describing a shape of a first sheet pattern of FIG. 2. FIG. 6 is an exemplary view for describing a three-dimensional shape of a semiconductor liner layer of FIG. 2. FIG. 7 is an exemplary view for describing a three-dimensional shape of each of a lower semiconductor insertion layer and an upper semiconductor insertion layer of FIG. 2. FIGS. 8 to 10 are cross-sectional views taken along lines D-D, E-E, and F-F of FIG. 2, respectively. FIGS. 11 and 12 are schematic views illustrating a germanium fraction along a scan line of FIG. 2.

For reference, FIG. 2 is a cross-sectional view taken along a first lower pattern BP1 extending in a first direction D1. FIGS. 8 to 10 are cross-sectional views respectively shown on a D1-D2 plane. FIG. 1 is a plan view illustrated on the D1-D2 plane, and thus FIGS. 8 to 10 may be cross-sectional views each illustrated in a plan view. FIG. 8 is a cross-sectional view taken along a first sheet pattern NS1. FIGS. 9 and 10 may each be a cross-sectional view taken along a space between the first sheet patterns NS1 adjacent to each other in a third direction D3.

FIG. 1 is a simplified view excluding a first gate insulating layer 130, an etch stop layer 185, an interlayer insulating layer 190, and the like.

Referring to FIGS. 1 to 12, the semiconductor device according to some exemplary embodiments may include a first active pattern AP1, a plurality of first gate structures GS1, and a first source/drain pattern 150.

The semiconductor device may include a substrate 100. The substrate 100 may be bulk silicon or a silicon-on-insulator (SOI). Alternatively, the substrate 100 may be a silicon substrate or may include another material such as silicon germanium, a silicon-germanium on insulator (SGOI), indium antimonide, a lead tellurium compound, indium arsenide, indium phosphide, gallium arsenide, or gallium antimonide. The present disclosure is not limited to these examples.

The first active pattern AP1 may be on the substrate 100. The first active pattern AP1 may be elongated in the first direction D1. For example, the first active pattern AP1 may be in a region in which a p-type metal-oxide-semiconductor (PMOS) is formed.

The first active pattern AP1 may be, for example, a multi-channel active pattern. In the semiconductor device according to some exemplary embodiments, the first active pattern AP1 may include the first lower pattern BP1 and a plurality of first sheet patterns NS1.

The first lower pattern BP1 may protrude from the substrate 100. The first lower pattern BP1 may be elongated in the first direction D1.

The plurality of first sheet patterns NS1 may be on an upper surface BP1_US of the first lower pattern BP1. The plurality of first sheet patterns NS1 may be spaced apart from the first lower pattern BP1 in the third direction D3, as best seen in FIG. 3. The first sheet patterns NS1 may be spaced apart from each other in the third direction D3.

Each of the first sheet patterns NS1 may include an upper surface NS1_US and a lower surface NS1_BS. The upper surface NS1_US of one of the first sheet patterns is a surface opposite to the lower surface NS1_BS of the one first sheet pattern in the third direction D3. Each of the first sheet patterns NS1 may include first sidewalls NS1_SW1 opposite to each other in the first direction D1 and second sidewalls NS1_SW2 opposite to each other in a second direction D2.

The upper surface NS1_US of the first sheet pattern may be connected to the lower surface NS1_BS of the first sheet pattern through the first sidewalls NS1_SW1 and the second sidewalls NS1_SW2 of the first sheet pattern. The first sidewall NS1_SW1 of the first sheet pattern is connected to and in contact with the first source/drain pattern 150 to be described below. The first sidewall NS1_SW1 of the first sheet pattern may be an end of the first sheet pattern NS1.

In FIG. 8, the first sidewall NS1_SW1 of the first sheet pattern is illustrated as having a curved surface, but the present disclosure is not limited thereto. Unlike that illustrated in the drawings, in some embodiments, the first sidewall NS1_SW1 of the first sheet pattern may include a planar portion and a curved portion. In some embodiments, the entire first sidewall NS1_SW1 of the first sheet pattern may be planar.

In addition, in FIGS. 3 and 5, the second sidewall NS1_SW2 of the first sheet pattern is illustrated as being a combination of a curved portion and a planar portion, but the present disclosure is not limited thereto. That is, the entire second sidewall NS1_SW2 of the first sheet pattern may be a curved surface, or may be planar.

The third direction D3 may be a direction crossing the first direction D1 and the second direction D2. For example, the third direction D3 may be a thickness direction of the substrate 100. The first direction D1 may be a direction crossing the second direction D2. The third direction D3 may be a vertical direction and the first and second directions D1 and D2 may be horizontal directions.

It is illustrated in the drawing that three first sheet patterns NS1 are spaced apart from each other in the third direction D3, but this is only for convenience of description, and the present disclosure is not limited thereto.

The first lower pattern BP1 may be formed by etching a portion of the substrate 100 and may include an epitaxial layer grown from the substrate 100. The first lower pattern BP1 may include silicon or germanium, which is an elemental semiconductor material. In addition, the first lower pattern BP1 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound doped with a group IV element in the binary or ternary compound.

The group III-V compound semiconductor may be, for example, one of a binary compound, a ternary compound, and a quaternary compound, which is formed by a combination of at least one of aluminum (Al), gallium (Ga), and indium (In) as a group III element, with one of phosphorus (P), arsenic (As), and antimony (Sb) as a group V element.

The first sheet pattern NS1 may include one of silicon or germanium, which is an elemental semiconductor material, a group IV-IV compound semiconductor, or a group III-V compound semiconductor. Each of the first sheet patterns NS1 may include the same material as the first lower pattern BP1 and may include a material different from that of the first lower pattern BP1.

In the semiconductor device according to some exemplary embodiments, the first lower pattern BP1 may be a silicon lower pattern including silicon, and the first sheet pattern NS1 may be a silicon sheet pattern including silicon.

A width of each the first sheet patterns NS1 in the second direction D2 may increase or decrease in proportion to a width of the first lower pattern BP1 in the second direction D2. For example, it is illustrated in the figures that the widths in the second direction D2 of the first sheet patterns NS1, which are stacked in the third direction D3, are the same, but this is only for convenience of description, and the present disclosure is not limited thereto. In some embodiments, unlike that illustrated in the drawings, the widths of the first sheet patterns NS1 in the second direction D2, which are stacked in the third direction D3, may be reduced as a distance from the first lower pattern BP1 increases.

A field insulating layer 105 may be formed on the substrate 100. The field insulating layer 105 may be on a sidewall of the first lower pattern BP1. The field insulating layer 105 may be absent from the upper surface BP1_US of the first lower pattern.

In some embodiments, the field insulating layer 105 may entirely cover the sidewall of the first lower pattern BP1. In some embodiments, unlike that illustrated in the drawings, the field insulating layer 105 may cover a portion of the sidewall of the first lower pattern BP1. In this case, a portion of the first lower pattern BP1 may protrude further than an upper surface of the field insulating layer 105 in the third direction D3.

Each of the first sheet patterns NS1 may be arranged higher than the upper surface of the field insulating layer 105. The field insulating layer 105 may include, for example, an oxide layer, a nitride layer, an oxynitride layer, or a combination thereof. The field insulating layer 105 is illustrated as being a single layer, but this is only for convenience of description, and the present disclosure is not limited thereto.

The plurality of first gate structures GS1 may be on the substrate 100. Each of the first gate structures GS1 may extend in the second direction D2. The first gate structures GS1 may be arranged to be spaced apart from each other in the first direction D1. The first gate structures GS1 may be adjacent to each other in the first direction D1.

The first gate structures GS1 may be on the first active pattern AP1. The first gate structures GS1 may intersect or cross the first active pattern AP1.

The first gate structures GS1 may intersect or cross the first lower pattern BP1. The first gate structures GS1 may surround the respective first sheet patterns NS1.

The first gate structure GS1 may include, for example, a first gate electrode 120, the first gate insulating layer 130, a first gate spacer 140, and a first gate capping pattern 145.

The first gate electrode 120 may be formed on the first lower pattern BP1. The first gate electrode 120 may intersect the first lower pattern BP1. The first gate electrode 120 may surround the first sheet pattern NS1.

A portion of the first gate electrode 120 may be between the first sheet patterns NS1 adjacent to each other in the third direction D3. When the semiconductor device includes a first of the first sheet patterns and a second of the first sheet patterns, which are adjacent to each other, a portion of the first gate electrode 120 may be between the upper surface NS1_US of the first of the sheet patterns and the lower surface NS1_BS of the second of the first sheet patterns facing each other.

The first gate electrode 120 may include at least one of a metal, a metal alloy, a conductive metal nitride, a metal silicide, a doped semiconductor material, a conductive metal oxide, and a conductive metal oxynitride. The first gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminide (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination of any of the above, but the present disclosure is not limited thereto. The conductive metal oxide and the conductive metal oxynitride may be included in an oxidized form of the above-described materials, but the present disclosure is not limited thereto.

The first gate electrodes 120 may be on both sides of the first source/drain pattern 150 to be described below. The first gate structures GS1 may be on both sides of the first source/drain pattern 150 in the first direction D1.

In some embodiments, all of the first gate electrodes 120 on both sides of the first source/drain pattern 150 may be normal gate electrodes used as a gate of a transistor. In some embodiments, the first gate electrode 120 on one side of the first source/drain pattern 150 may be used as a gate of the transistor, but the first gate electrode 120 on the other side of the first source/drain pattern 150 may be a dummy gate electrode.

The first gate insulating layer 130 may extend along the upper surface of the field insulating layer 105 and the upper surface BP1_US of the first lower pattern. The first gate insulating layer 130 may surround the plurality of first sheet patterns NS1. The first gate insulating layer 130 may be along a circumference of each of the first sheet patterns NS1. The first gate electrode 120 may be on the first gate insulating layer 130. The first gate insulating layer 130 may be between the first gate electrode 120 and the first sheet patterns NS1.

A portion of the first gate insulating layer 130 may be between the first sheet patterns NS1 adjacent to each other in the third direction D3. When the semiconductor device includes the first of the first sheet patterns and the second of the first sheet patterns adjacent to each other, a portion of the first gate insulating layer 130 may extend along the upper surface NS1_US of the first of the first sheet patterns and the lower surface NS1_BS of the second of the first sheet patterns facing each other.

The first gate insulating layer 130 may include silicon oxide, silicon oxynitride, silicon nitride, or a high dielectric constant (high-k) material having a higher dielectric constant than silicon oxide. The high-k material may include, as non-limiting examples, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead-zinc niobate.

The first gate insulating layer 130 is illustrated as being a single layer, but this is only for convenience of description, and the present disclosure is not limited thereto. The first gate insulating layer 130 may include a plurality of layers. The first gate insulating layer 130 may include an interfacial layer between the first sheet pattern NS1 and the first gate electrode 120, and a high-k insulating layer.

The semiconductor device according to some exemplary embodiments may include a negative capacitance (NC) FET using a negative capacitor. For example, the first gate insulating layer 130 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the sum of the capacitances of the two or more capacitors is less than the capacitance of each individual capacitor. On the other hand, when at least one of the capacitances of two or more capacitors connected in series has a negative value, the sum of the capacitances of the two or more capacitors may have a positive value and may be greater than the absolute value of each individual capacitance.

When a ferroelectric material layer having a negative capacitance and a paraelectric material layer having a positive capacitance are connected in series, the total capacitance value of the ferroelectric material layer and the paraelectric material layer connected in series may increase. Using the fact that the total capacitance value increases, a transistor including the ferroelectric material layer may have a subthreshold swing (SS) of less than 60 mV/decade at room temperature.

The ferroelectric material layer of the first gate insulating layer 130 may have ferroelectric properties. The ferroelectric material layer may include, as non-limiting examples, at least one of hafnium oxide, hafnium zirconium oxide, barium strontium titanium oxide, barium titanium oxide, and lead zirconium titanium oxide. In some embodiments, the hafnium zirconium oxide may be a material obtained by doping hafnium oxide with zirconium (Zr). In some embodiments, the hafnium zirconium oxide may be a compound of hafnium (Hf), zirconium (Zr), and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material layer may vary depending on the type of ferroelectric material included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), and yttrium (Y).

When the dopant is aluminum (Al), the ferroelectric material layer may include 3 to 8 at % (atomic %) of aluminum. Here, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer of the first gate insulating layer 130 may have paraelectric properties. The paraelectric material layer may include, for example, at least one of silicon oxide and metal oxide having a high dielectric constant. The metal oxide included in the paraelectric material layer may include, for example, at least one of hafnium oxide, zirconium oxide, and aluminum oxide, but the present disclosure is not limited thereto.

The ferroelectric material layer and the paraelectric material layer may include the same material. The ferroelectric material layer has ferroelectric properties, but the paraelectric material layer may not have ferroelectric properties. For example, when the ferroelectric material layer and the paraelectric material layer both include hafnium oxide, the crystal structure of the hafnium oxide included in the ferroelectric material layer may differ from that of the hafnium oxide included in the paraelectric material layer.

The ferroelectric material layer may have a thickness enough to have ferroelectric properties. The thickness of the ferroelectric material layer may be, for example, in a range of 0.5 to 10 nm, but the present disclosure is not limited thereto. The thickness of the ferroelectric material layer may vary depending on the type of ferroelectric material because the critical thickness representing the ferroelectric properties may vary for each ferroelectric material.

In an example, the first gate insulating layer 130 may include one ferroelectric material layer. In another example, the first gate insulating layer 130 may include a plurality of ferroelectric material layers spaced apart from each other. The first gate insulating layer 130 may have a stacked structure in which a plurality of ferroelectric material layers and a plurality of paraelectric material layers are alternately stacked.

The first gate spacer 140 may be on a sidewall of the first gate electrode 120. The first gate spacer 140 may be absent from between the first lower pattern BP1 and the first sheet pattern NS1 and from between the first sheet patterns NS1 adjacent to each other in the third direction D3.

The first gate spacer 140 may include an inner sidewall 140_ISW2 and a connection sidewall 140_ISW1. The inner sidewall 140_ISW2 of the first gate spacer may face the sidewall of the first gate electrode 120 extending in the second direction D2. The inner sidewall 140_ISW2 of the first gate spacer may extend in the second direction D2. The inner sidewall 140_ISW2 of the first gate spacer may be a surface opposite to the outer sidewall facing the interlayer insulating layer 190.

The connection sidewall 140_ISW1 of the first gate spacer may be connected to the inner sidewall 140_ISW2 of the first gate spacer. The connection sidewall 140_ISW1 of the first gate spacer may extend in the first direction D1.

The first gate spacer 140 may include a spacer hole 140_H extending in the third direction D3. The spacer hole 140_H may be defined by the first lower pattern BP1 and the connection sidewall 140_ISW1 of the first gate spacer.

It is illustrated in the drawing that a portion of the first sheet pattern NS1 passes through the spacer hole 140_H and is arranged inside the spacer hole 140_H, but the present disclosure is not limited thereto. In some embodiments, unlike that illustrated in the drawings, the first sheet pattern NS1 may not include a portion overlapping the first gate spacer 140 in the second direction D2. The first sheet pattern NS1 may be connected to the first source/drain pattern 150 through the spacer hole 140_H.

The first gate insulating layer 130 may extend along the inner sidewall 140_ISW2 of the first gate spacer. The first gate insulating layer 130 may be in contact with the inner sidewall 140_ISW2 of the first gate spacer.

The first gate spacer 140 may include, for example, at least one of silicon nitride (SiN), silicon oxynitride (SiON), silicon oxide (SiO$_2$), silicon oxycarbide (SiOCN), silicon boron nitride (SiBN), silicon oxyboron nitride (SiOBN), silicon oxycarbide (SiOC), or a combination thereof. The first gate spacer 140 is illustrated as being a single layer, but this is only for convenience of description, and the present disclosure is not limited thereto.

The first gate capping pattern 145 may be on the first gate electrode 120 and the first gate spacer 140. An upper surface of the first gate capping pattern 145 may be coplanar with an upper surface of the interlayer insulating layer 190. Unlike that illustrated in the drawings, the first gate capping pattern 145 may be between the first gate spacers 140.

The first gate capping pattern 145 may include, as non-limiting examples, at least one of silicon nitride (SiN), silicon oxynitride (SiON), silicon carbonitride (SiCN), silicon oxycarbonitride (SiOCN), or a combination thereof. The first gate capping pattern 145 may include a material having an etch selectivity with respect to the interlayer insulating layer 190.

The first source/drain pattern 150 may be formed on the first active pattern AP1. The first source/drain pattern 150 may be on the first lower pattern BP1. The first source/drain pattern 150 may be connected to the first sheet patterns NS1. The first source/drain pattern 150 may be in contact with the first sheet patterns NS1.

The first source/drain pattern 150 may be on a side surface of the first gate structure GS1. The first source/drain pattern 150 may be between the first gate structures GS1 adjacent to each other in the first direction D1. For example, the first source/drain patterns 150 may be on both sides of the first gate structure GS1. In some embodiments, unlike that illustrated in the drawings, the first source/drain pattern 150 may be on one side of the first gate structure GS1 and may be absent from the other side of the first gate structure GS1.

The first source/drain pattern 150 may be included in a source/drain of the transistor using the first sheet pattern NS1 as a channel region.

The first source/drain pattern 150 may be in a first source/drain recess 150R. The first source/drain recess 150R may extend in the third direction D3. The first source/drain recess 150R may be defined between the first gate structures GS1 adjacent to each other in the first direction D1.

A bottom surface of the first source/drain recess 150R may be defined by the first lower pattern BP1. A sidewall of the first source/drain recess 150R may be defined by the first sheet pattern NS1 and the first gate structure GS1. In the first gate structure GS1, the first gate insulating layer 130 and the first gate spacer 140 may define a portion of the first source/drain recess 150R. In FIGS. 8 to 10, the first source/drain recess 150R includes the connection sidewall 140_ISW1 of the first gate spacer.

It is illustrated in the drawing that a width of an upper portion of the sidewall of the first source/drain recess 150R in the first direction D1 decreases as increases in distance from the first lower pattern BP1, but the present disclosure is not limited thereto.

A portion of the first source/drain pattern 150 may pass through the spacer hole 140_H. The first source/drain pattern 150 may fill at least a portion of the spacer hole 140_H. The first source/drain pattern 150 may be in contact with the first sheet pattern NS1 through the spacer hole 140_H. A portion of the first source/drain pattern 150 may be in contact with the connection sidewall 140_ISW1 of the first gate spacer.

The first gate spacer 140 may be absent from between the first source/drain pattern 150 and the first gate electrode 120 between the adjacent first sheet patterns NS1. The first gate insulating layer 130 may be in contact with the first source/drain pattern 150.

Between the first sheet pattern NS1 at the lowermost portion and the first lower pattern BP1, a boundary between the first gate insulating layer 130 and the first lower pattern BP1 may be the upper surface BP1_US of the first lower pattern. In other words, in FIG. 2, the first gate structure GS1 may include the first lower pattern BP1 and a lowermost sub-gate structure between the first sheet patterns NS1 arranged at the lowermost portion. The lowermost sub-gate structure may include a portion of the first gate electrode 120 and a portion of the first gate insulating layer 130. The upper surface BP1_US of the first lower pattern may be a boundary between the lowermost sub-gate structure and the first lower pattern BP1. At this point, the bottom surface of the first source/drain recess 150R may be lower in height than the upper surface BP1_US of the first lower pattern.

The first source/drain pattern 150 may include a semiconductor liner layer 151, at least one or more semiconductor insertion layers 152 and 153, a semiconductor filling layer 154, and a semiconductor capping layer 155. The at least one or more semiconductor insertion layers 152 and 153 may be between the semiconductor liner layer 151 and the semiconductor filling layer 154.

In the semiconductor device according to some exemplary embodiments, the first source/drain pattern 150 may include a lower semiconductor insertion layer 152 and an upper semiconductor insertion layer 153.

The semiconductor liner layer 151 may extend along the first source/drain recess 150R. The semiconductor liner layer 151 may be in contact with the first gate insulating layer 130, the first sheet pattern NS1, and the first lower pattern BP1.

In FIG. 6, the semiconductor liner layer 151 may have a U-shape. In the cross-sectional view taken along the first direction D1, the semiconductor liner layer 151 may have a U-shape.

The semiconductor liner layer 151 may include an outer sidewall 151_OSW and an inner sidewall 151_ISW. The outer sidewall 151_OSW of the semiconductor liner layer is in contact with the first gate insulating layer 130, the first sheet pattern NS1, and the first lower pattern BP1. The outer sidewall 151_OSW of the semiconductor liner layer is directly connected to the first sidewall NS1_SW1 of the first sheet pattern. The outer sidewall 151_OSW of the semiconductor liner layer may represent a profile of the first source/drain recess 150R.

The inner sidewall 151_ISW of the semiconductor liner layer may be a surface opposite to the outer sidewall 151_OSW of the semiconductor liner layer. As the semiconductor liner layer 151 increases in distance from the outer sidewall 151_OSW, a width of the inner sidewall 151_ISW of the semiconductor liner layer in the second direction D2 may be reduced.

In FIGS. 8 to 10, the inner sidewall 151_ISW of the semiconductor liner layer may include a facet portion 151_ISW1 and a connection portion 151_ISW2. The facet portion 151_ISW1 of the inner sidewall 151_ISW of the semiconductor liner layer may extend from the connection sidewall 140_ISW1 of the first gate spacer. The facet portion 151_ISW1 of the inner sidewall 151_ISW of the semiconductor liner layer may form an acute angle with the connection sidewall 140_ISW1 of the first gate spacer. The connection portion 151_ISW2 of the inner sidewall 151_ISW of the semiconductor liner layer may extend in the second direction D2. The connection portion 151_ISW2 of the inner sidewall 151_ISW of the semiconductor liner layer may include a curved portion.

The semiconductor liner layer 151 may include, for example, silicon-germanium. The semiconductor liner layer 151 may include a silicon-germanium layer. The semiconductor liner layer 151 may include doped p-type impurities. For example, the p-type impurities may include boron (B), but the present disclosure is not limited thereto.

The lower semiconductor insertion layer 152 and the upper semiconductor insertion layer 153 may each have a three-dimensional saddle structure.

Each of the lower semiconductor insertion layer 152 and the upper semiconductor insertion layer 153 may include a saddle point SP, a first saddle region SR1, and a second saddle region SR2. The first saddle region SR1 may be a region located in the second direction D2 of the saddle point SP. The first saddle region SR1 may extend in the third direction D3 close to the first lower pattern BP1. The second saddle region SR2 may be a region located in the first direction D1 of the saddle point SP. The second saddle region SR2 may extend in the third direction D3 away from the first lower pattern BP1.

In the cross-sectional view taken along the first direction D1, the lower semiconductor insertion layer 152 and the upper semiconductor insertion layer 153 may each have a U-shape. In the cross-sectional view taken along the second direction D2 through the saddle point SP, the lower semiconductor insertion layer 152 and the upper semiconductor insertion layer 153 may each have an inverted U-shape.

It is illustrated in FIG. 7 that the thickness is the same throughout the lower semiconductor insertion layer 152 and the upper semiconductor insertion layer 153 each having a saddle structure, but this is only for convenience of description, and the present disclosure is not limited thereto.

The lower semiconductor insertion layer 152 may be arranged on the semiconductor liner layer 151. The lower semiconductor insertion layer 152 may be arranged on the inner sidewall 151_ISW of the semiconductor liner layer. For example, the lower semiconductor insertion layer 152 may be in contact with the semiconductor liner layer 151.

The lower semiconductor insertion layer 152 may cover at least a portion of the inner sidewall 151_ISW of the semiconductor liner layer. The lower semiconductor insertion layer 152 may cover the facet portion 151_ISW1 of the inner sidewall 151_ISW of the semiconductor liner layer and the connection portion 151_ISW2 of the inner sidewall 151_ISW of the semiconductor liner layer.

The lower semiconductor insertion layer 152 may include, for example, silicon-germanium. The lower semiconductor insertion layer 152 may include a silicon-germanium layer. The lower semiconductor insertion layer 152 may include doped p-type impurities.

The upper semiconductor insertion layer 153 may be on the lower semiconductor insertion layer 152. The upper semiconductor insertion layer 153 may be in contact with the lower semiconductor insertion layer 152.

In FIG. 2, the upper semiconductor insertion layer 153 may include a sidewall portion 153SP extending along the sidewall of the first source/drain recess 150R and a bottom portion 153BP extending along the bottom surface of the first source/drain recess 150R. For example, a thickness t11 of the bottom portion 153BP of the upper semiconductor insertion layer may be equal to a thickness t12 of the sidewall portion 153SP of the upper semiconductor insertion layer.

The upper semiconductor insertion layer 153 may extend along at least a portion of a profile of the lower semiconductor insertion layer 152.

In some embodiments, the upper semiconductor insertion layer 153 may include silicon-germanium. The upper semiconductor insertion layer 153 may include a silicon-germanium layer. In some embodiments, the upper semiconductor insertion layer 153 may include silicon. The upper semiconductor insertion layer 153 may include a silicon layer. The upper semiconductor insertion layer 153 may include doped p-type impurities.

The semiconductor filling layer 154 is on the upper semiconductor insertion layer 153. The semiconductor filling layer 154 may be in contact with the upper semiconductor insertion layer 153. A bottom surface of the semiconductor filling layer 154 facing the upper semiconductor insertion layer 153 may have a saddle shape.

The semiconductor filling layer 154 may include, for example, silicon-germanium. The semiconductor filling layer 154 may include a silicon-germanium layer. The semiconductor filling layer 154 may include doped p-type impurities.

The semiconductor capping layer 155 is arranged on the semiconductor filling layer 154. The semiconductor capping layer 155 may be in contact with the semiconductor filling layer 154.

In some embodiments, the semiconductor capping layer 155 may include silicon. The semiconductor capping layer 155 may include a silicon layer. In another example, the semiconductor capping layer 155 may include silicon-germanium. When the semiconductor capping layer 155 includes silicon-germanium, a germanium fraction of the semiconductor capping layer 155 may be less than a germanium fraction of the semiconductor liner layer 151, but the present disclosure is not limited thereto. The semiconductor capping layer 155 may include doped p-type impurities, but the present disclosure is not limited thereto.

In some embodiments, unlike that illustrated in the drawings, the first source/drain pattern 150 may not include the semiconductor capping layer 155.

In FIG. 11, when the upper semiconductor insertion layer 153 includes silicon-germanium, a germanium fraction of the upper semiconductor insertion layer 153 may be less than a germanium fraction of the lower semiconductor insertion layer 152 and a germanium fraction of the semiconductor filling layer 154. The germanium fraction of the upper semiconductor insertion layer 153 may be less than the germanium fraction of the semiconductor liner layer 151. In some embodiments, unlike that illustrated in the drawings, the germanium fraction of the upper semiconductor insertion layer 153 may be equal to the germanium fraction of the semiconductor liner layer 151.

In FIG. 12, the upper semiconductor insertion layer 153 may include a silicon layer. The germanium fraction of the upper semiconductor insertion layer 153 may be less than the germanium fraction of the semiconductor liner layer 151, the germanium fraction of the lower semiconductor insertion layer 152, and the germanium fraction of the semiconductor filling layer 154.

The germanium fraction of the lower semiconductor insertion layer 152 may be greater than the germanium fraction of the semiconductor liner layer 151 and may be less than the germanium fraction of the semiconductor filling layer 154.

For example, the germanium fraction of the upper semiconductor insertion layer 153 may be less than or equal to 5%. Since the germanium fraction of the upper semiconductor insertion layer 153 may be less than the germanium fraction of the lower semiconductor insertion layer 152 and the germanium fraction of the semiconductor filling layer 154, a defect such as a stacking fault may occur in the semiconductor filling layer 154 when the thickness of the upper semiconductor insertion layer 153 increases. In order to prevent this, the upper semiconductor insertion layer 153 may have, for example, a thickness of 1 nm to 3 nm.

The first source/drain pattern 150 may fill at least a portion of the spacer hole 140_H. The semiconductor liner layer 151, the lower semiconductor insertion layer 152, and the upper semiconductor insertion layer 153 are illustrated as being arranged in the spacer hole 140_H, but the present disclosure is not limited thereto. The layers included in the first source/drain pattern 150 shown in the spacer hole 140_H may vary depending on the position at which the first gate spacer 140 is cut.

Since each of the lower semiconductor insertion layer 152 and the upper semiconductor insertion layer 153 has a saddle structure, the shape of the first source/drain pattern 150 cut in the D1-D2 plane may be changed depending on the cutting position. In other words, in a plan view, the shape of the first source/drain pattern 150 may vary depending on the cutting position.

Figure 10A:
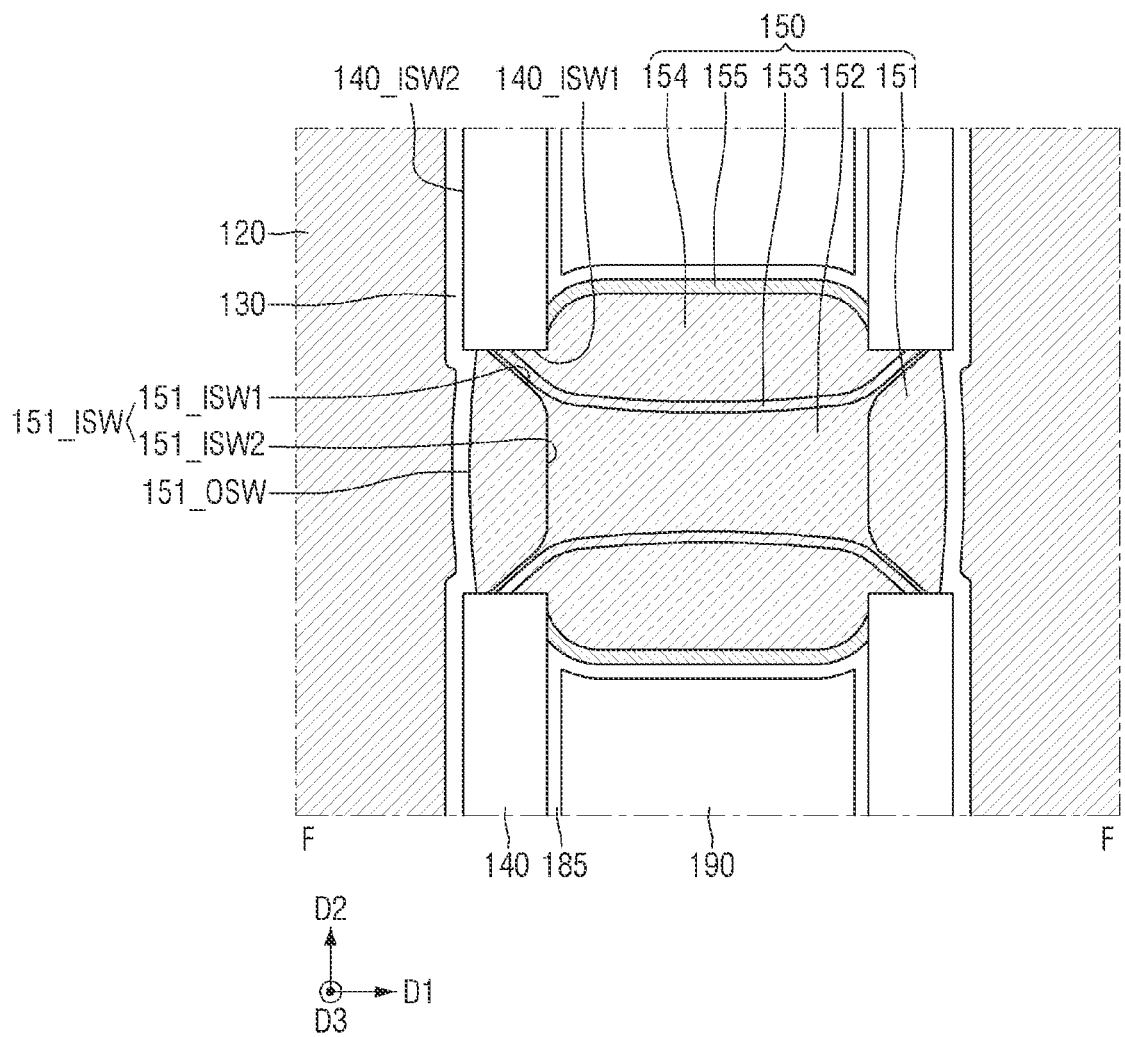
FIGS. 10A and 10B are each a cross-sectional view taken along line F-F of FIG. 2 according to some exemplary embodiments.
Figure 10B:
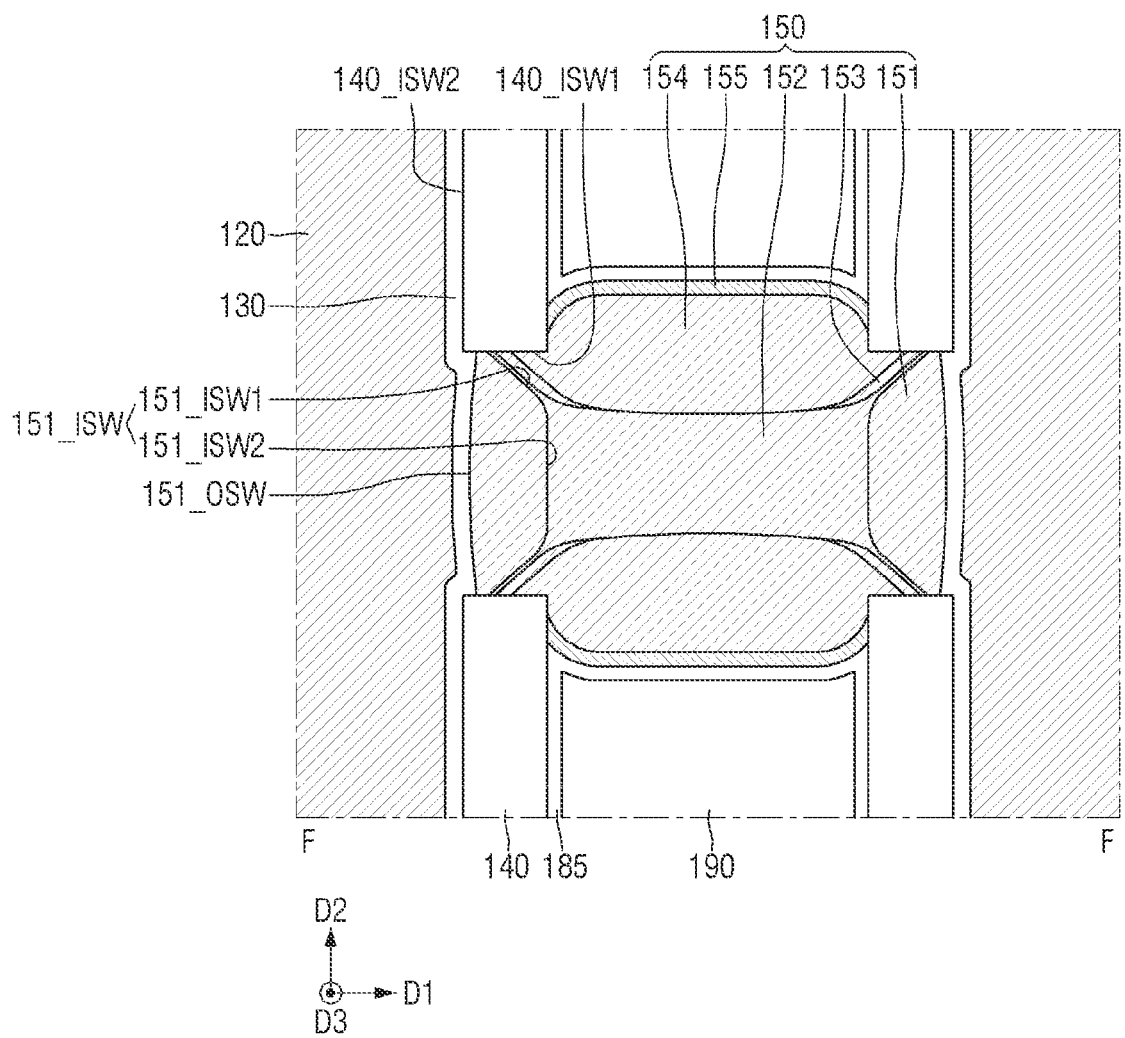

FIGS. 10A and 10B are cross-sectional views taken along the vicinity of the saddle point SP of the upper semiconductor insertion layer 153. FIGS. 8 and 9 are cross-sectional views taken along a portion above the saddle point SP of the upper semiconductor insertion layer 153. The lower semiconductor insertion layer 152 and the upper semiconductor insertion layer 153 of FIG. 10 may be the first saddle region SR1 of the saddle structure. The lower semiconductor insertion layer 152 and the upper semiconductor insertion layer 153 of FIGS. 8 and 9 may be the second saddle region SR2 of the saddle structure.

In FIGS. 8 to 10B, the lower semiconductor insertion layer 152 may entirely cover the inner sidewall 151_ISW of the semiconductor liner layer. The lower semiconductor insertion layer 152 may entirely cover the facet portion 151_ISW1 of the inner sidewall 151_ISW of the semiconductor liner layer and the connection portion 151_ISW2 of the inner sidewall 151_ISW of the semiconductor liner layer.

In FIGS. 8 and 9, the entire upper semiconductor insertion layer 153 may extend along the profile of the lower semiconductor insertion layer 152. The upper semiconductor insertion layer 153 may entirely cover the lower semiconductor insertion layer 152.

The upper semiconductor insertion layer 153 may entirely cover the facet portion 151_ISW1 of the inner sidewall 151_ISW of the semiconductor liner layer and the connection portion 151_ISW2 of the inner sidewall 151_ISW of the semiconductor liner layer. The upper semiconductor insertion layer 153 may be in contact with the connection sidewall 140_ISW1 of the first gate spacer. The upper semiconductor insertion layer 153 may extend along a portion of the connection sidewall 140_ISW1 of the first gate spacer.

The lower semiconductor insertion layer 152, the upper semiconductor insertion layer 153, and the semiconductor filling layer 154 may be sequentially stacked on the inner sidewall 151_ISW of the semiconductor liner layer in the first direction D1.

In FIGS. 10A and 10B, the lower semiconductor insertion layer 152 may extend in the first direction D1 from the inner sidewall 151_ISW of the semiconductor liner layer. In a plan view, the lower semiconductor insertion layer 152 may connect the inner sidewalls 151_ISW of the semiconductor liner layers, which are adjacent to each other in the first direction D1. The lower semiconductor insertion layer 152 may separate the semiconductor filling layer 154 into two portions.

The upper semiconductor insertion layer 153 may extend along at least a portion of a boundary between the lower semiconductor insertion layer 152 and the semiconductor filling layer 154. The upper semiconductor insertion layer 153 may extend along at least a portion of the profile of the lower semiconductor insertion layer 152.

In FIG. 10A, the upper semiconductor insertion layer 153 may be arranged entirely along the boundary between the lower semiconductor insertion layer 152 and the semiconductor filling layer 154. In FIG. 10B, the upper semiconductor insertion layer 153 may be arranged along a portion of the boundary between the lower semiconductor insertion layer 152 and the semiconductor filling layer 154.

In the cross-sectional view of the first source/drain pattern 150, not only the shape of the first source/drain pattern 150, but also the shape of the first source/drain pattern 150 below the cut surface may be shown on the cut surface. That is, the shape of the first source/drain pattern 150 cut in the D1-D2 plane may be viewed as that in either FIG. 10A or 10B.

Since the upper semiconductor insertion layer 153 entirely covers the facet portion 151_ISW1 of the inner sidewall 151_ISW of the semiconductor liner layer, the upper semiconductor insertion layer 153 may prevent the semiconductor filling layer 154 from being etched by an etchant that penetrates through the vicinity of the connection sidewall 140_ISW1 of the first gate spacer.

In the following descriptions, the drawing taken along line F-F of FIG. 2 will be described with reference to FIG. 10A.

The etch stop layer 185 may be on a sidewall of the first gate structure GS1, an upper surface of the first source/drain pattern 150, and a sidewall of the first source/drain pattern 150. Although not shown in the drawings, the etch stop layer 185 may be arranged on the upper surface of the field insulating layer 105.

The etch stop layer 185 may include a material having an etch selectivity with respect to the interlayer insulating layer 190 to be described below. The etch stop layer 185 may include at least one of, for example, silicon nitride (SiN), silicon oxynitride (SiON), silicon oxycarbide (SiOCN), silicon boron nitride (SiBN), silicon oxyboron nitride (SiOBN), silicon oxycarbide (SiOC), and a combination thereof.

The interlayer insulating layer 190 may be arranged on the etch stop layer 185. The interlayer insulating layer 190 may be on the first source/drain pattern 150. The interlayer insulating layer 190 may not cover the upper surface of the first gate capping pattern 145. For example, the upper surface of the interlayer insulating layer 190 may be coplanar with the upper surface of the first gate capping pattern 145.

The interlayer insulating layer 190 may include at least one of silicon oxide, silicon nitride, silicon oxynitride, and a low dielectric constant (low-k) material. For example, the low-k material may include fluorinated tetraethyl orthosilicate (FTEOS), hydrogen silsesquioxane (HSQ), bis-benzocyclobutene (BCB), tetramethyl orthosilicate (TMOS), octamethyleyclotetrasiloxane (OMCTS), hexamethyl disiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams (e.g., polypropylene oxide), carbon-doped silicon oxide (CDO), organo silicate glass (OSG), SiLK, amorphous fluorinated carbon, silica aerogels, silica xerogels, mesoporous silica, or a combination of any of the above materials, but the present disclosure is not limited thereto.

Figure 13:
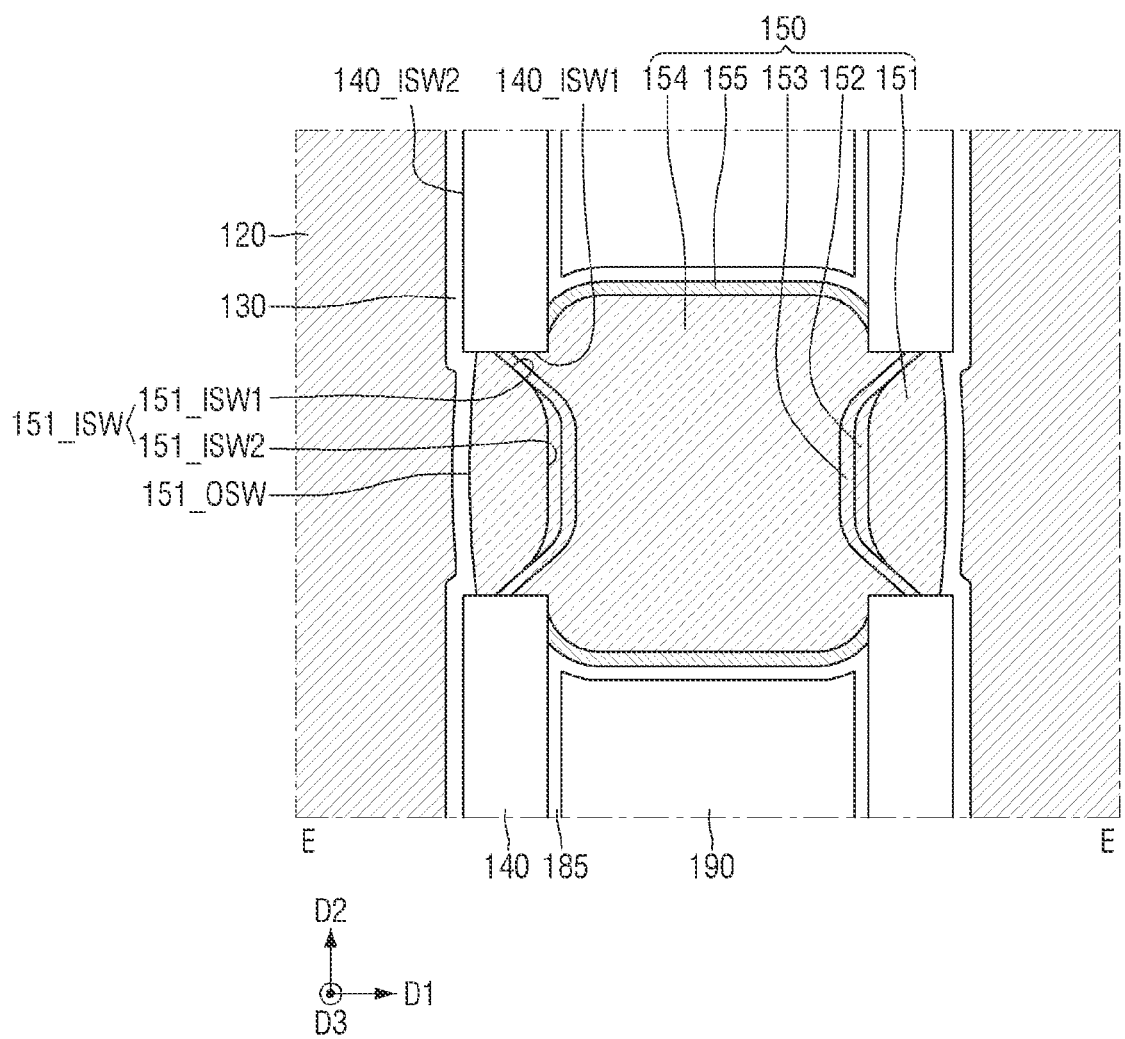
FIGS. 13 and 14 are views for describing a semiconductor device according to some exemplary embodiments.
Figure 14:
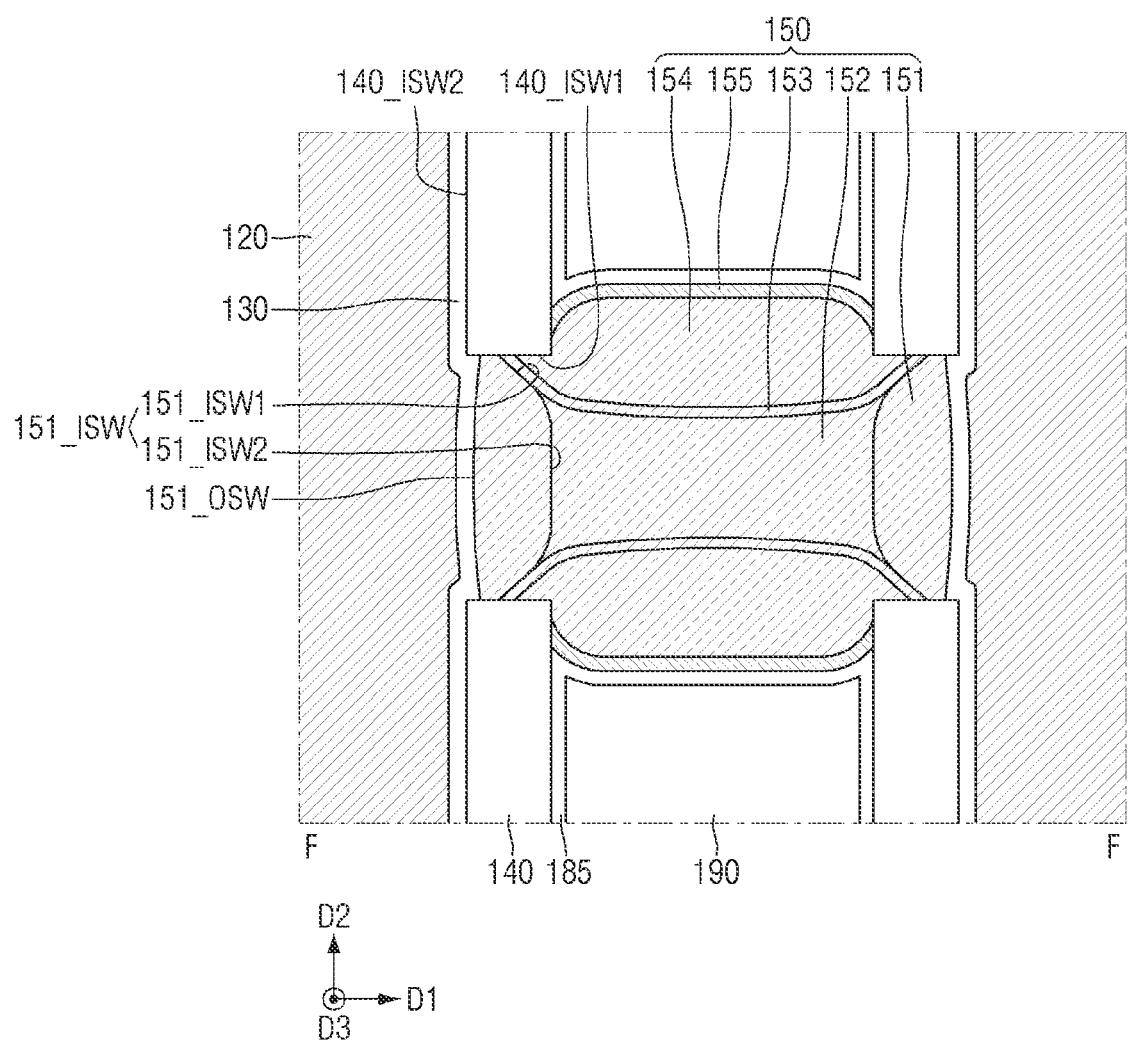

FIGS. 13 and 14 are views for describing a semiconductor device according to some exemplary embodiments. For convenience of description, differences from those described with reference to FIGS. 1 to 12 will be mainly described.

For reference, FIGS. 13 and 14 may be cross-sectional views taken along lines E-E and F-F of FIG. 2, respectively.

Referring to FIGS. 13 and 14, in the semiconductor device according to some exemplary embodiments, a lower semiconductor insertion layer 152 may cover a portion of an inner sidewall 151_ISW of a semiconductor liner layer.

In a plan view, the lower semiconductor insertion layer 152 may cover a portion of the inner sidewall 151_ISW of the semiconductor liner layer. The lower semiconductor insertion layer 152 may extend along a portion of the inner sidewall 151_ISW of the semiconductor liner layer.

The lower semiconductor insertion layer 152 may entirely cover a connection portion 151_ISW2 of the inner sidewall 151_ISW of the semiconductor liner layer. At least a portion of a facet portion 151_ISW1 of the inner sidewall 151_ISW of the semiconductor liner layer may be free from coverage by the lower semiconductor insertion layer 152.

In a plan view, an upper semiconductor insertion layer 153 may be in contact with the inner sidewall 151_ISW of the semiconductor liner layer in the facet portion 151_ISW1 of the inner sidewall 151_ISW of the semiconductor liner layer.

Figure 15:
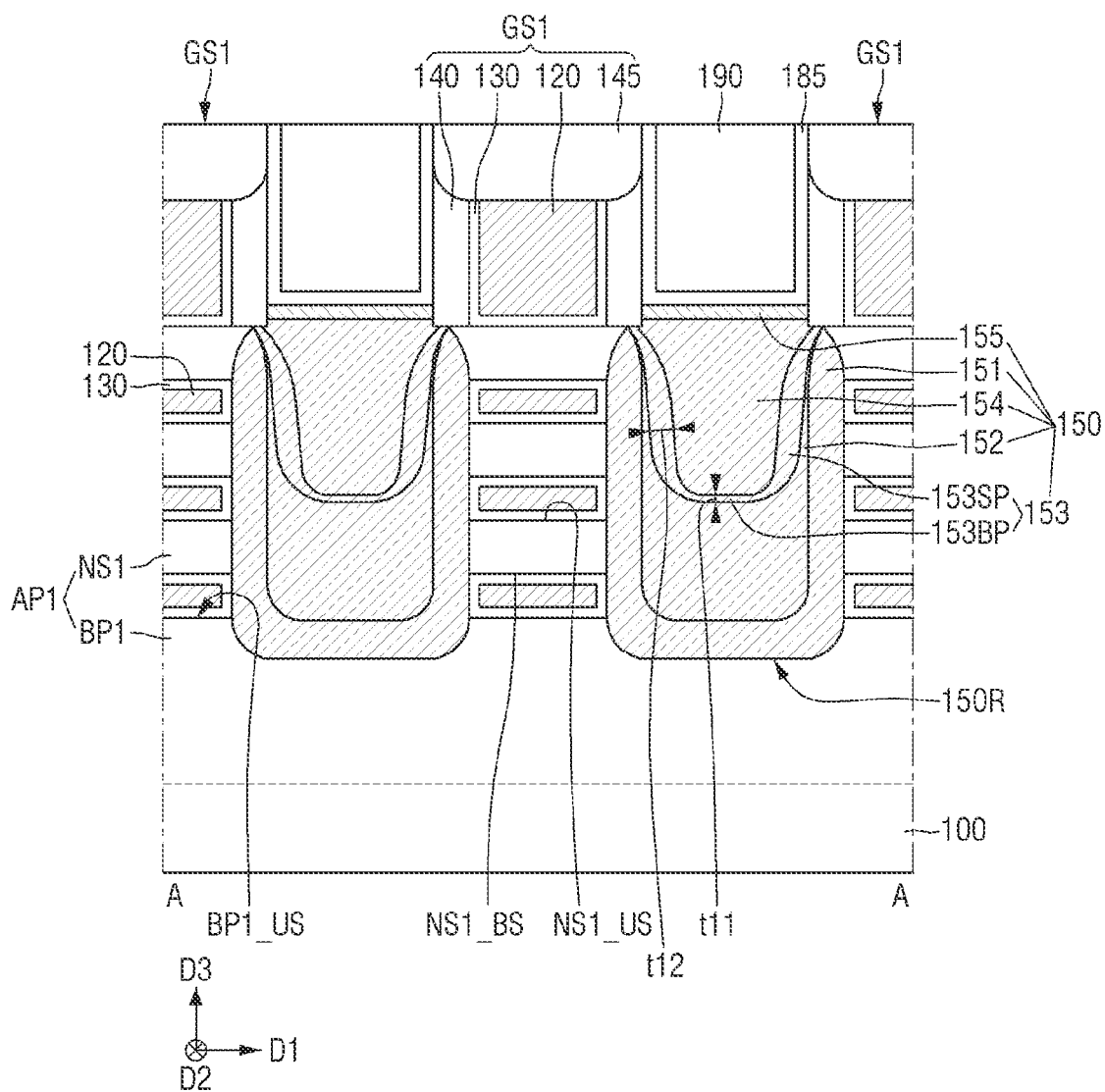
FIG. 15 is a view for describing a semiconductor device according to some exemplary embodiments.

FIG. 15 is a view for describing a semiconductor device according to some exemplary embodiments. For convenience of description, differences from those described with reference to FIGS. 1 to 12 will be mainly described.

Referring to FIG. 15, in the semiconductor device according to some exemplary embodiments, a thickness t11 of a bottom portion 153BP of an upper semiconductor insertion layer is different from a thickness t12 of a sidewall portion 153SP of the upper semiconductor insertion layer.

As seen in FIG. 15, which is taken along a first lower pattern BP1 extending in the first direction D1, the thickness t11 of the bottom portion 153BP of the upper semiconductor insertion layer may be less than the thickness t12 of the sidewall portion 153SP of the upper semiconductor insertion layer. The thickness t12 of the sidewall portion 153SP of the upper semiconductor insertion layer may be a thickness in the vicinity of a center portion of the sidewall portion 153SP of the upper semiconductor insertion layer extending in the third direction D3.

For example, the thickness t12 of the sidewall portion 153SP of the upper semiconductor insertion layer may increase and then decrease as it moves away from the first lower pattern BP1. In the vicinity of an upper surface NS1_US of a first sheet pattern arranged at the uppermost portion, the thickness of the sidewall portion 153SP of the upper semiconductor insertion layer may be less than the thickness t11 of the bottom portion 153BP of the upper semiconductor insertion layer.

Figure 16:
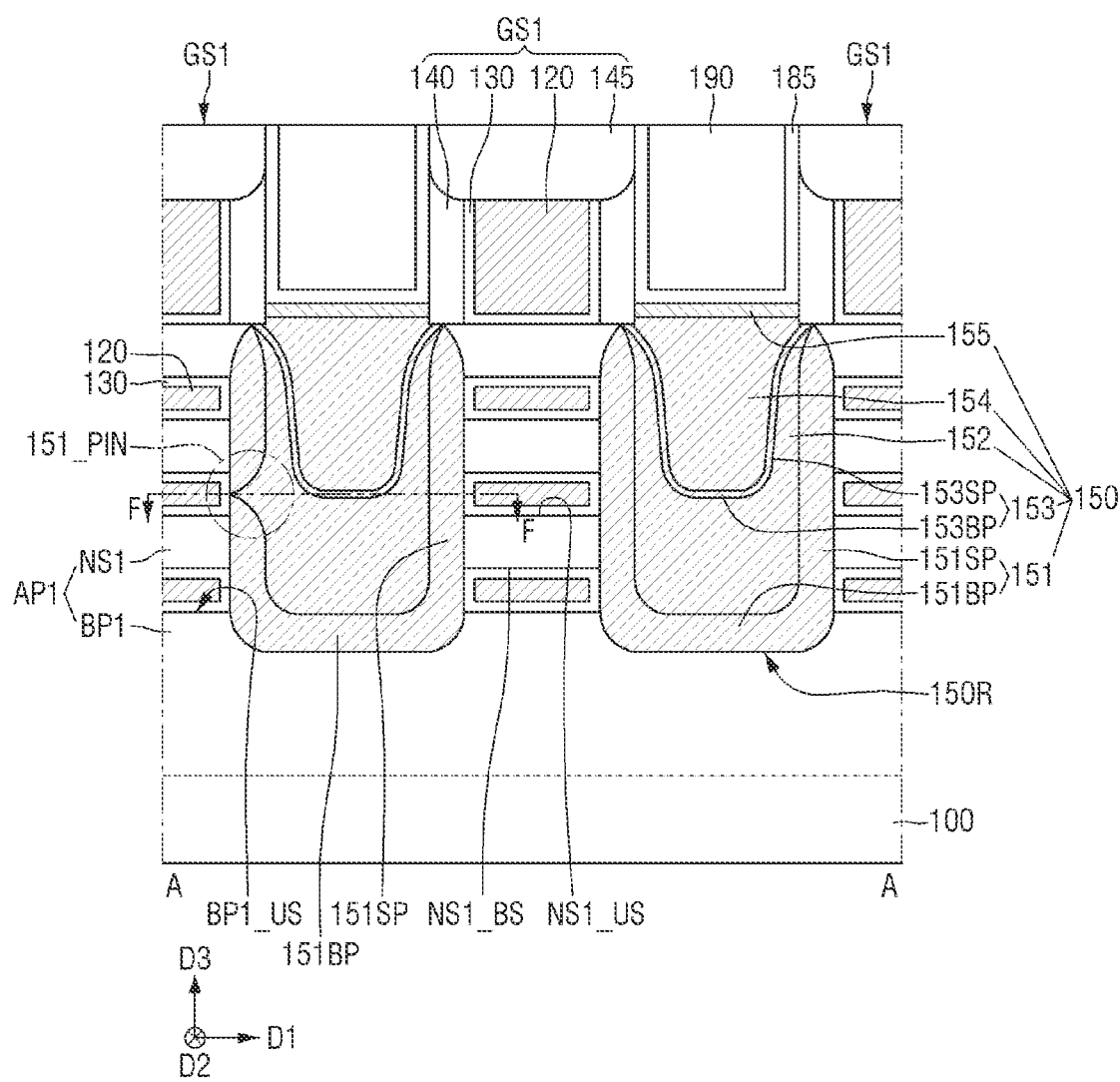
FIGS. 16 and 17 are views for describing a semiconductor device according to some exemplary embodiments.
Figure 17:
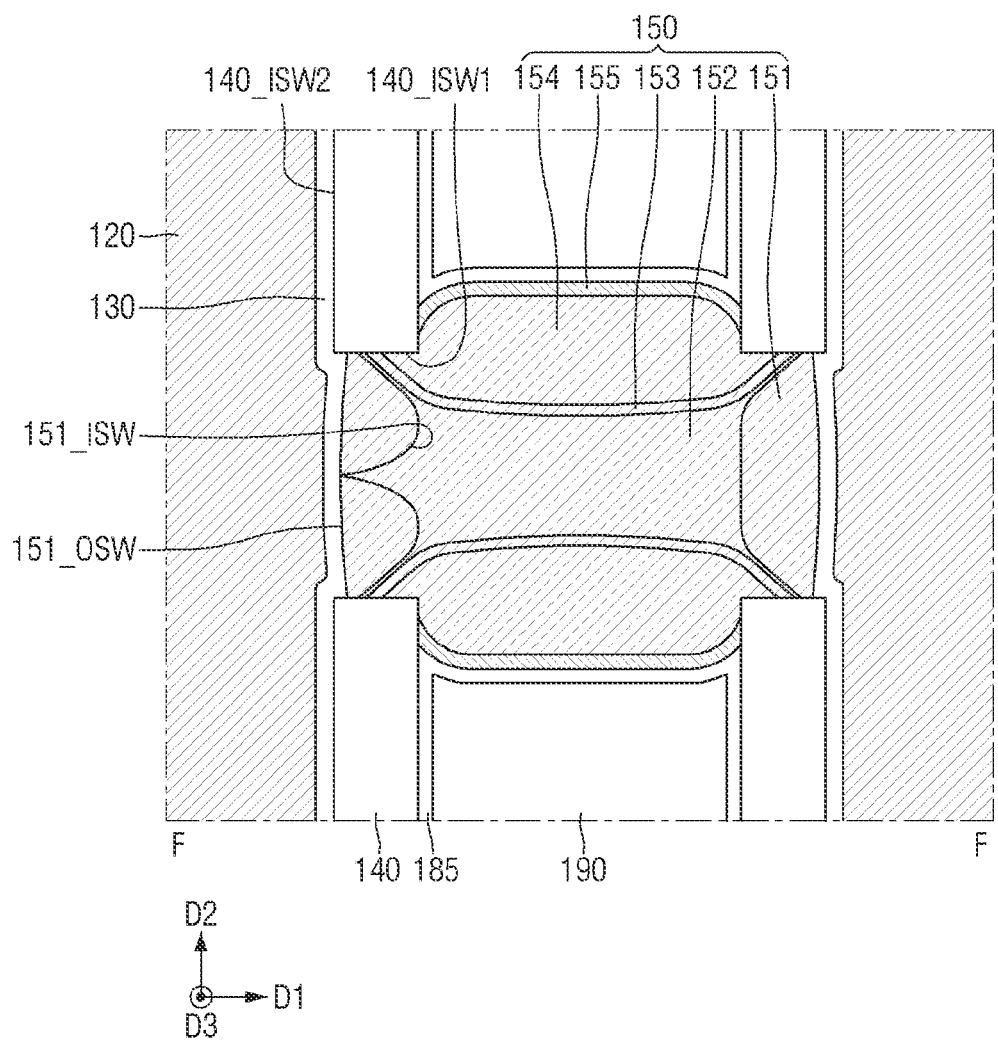

FIGS. 16 and 17 are views for describing a semiconductor device according to some exemplary embodiments. For convenience of description, differences from those described with reference to FIGS. 1 to 12 will be mainly described.

For reference, FIG. 16 may be a cross-sectional view taken along line A-A of FIG. 1. FIG. 17 may be a cross-sectional view taken along line F-F of FIG. 16.

Referring to FIGS. 16 and 17, in the semiconductor device according to some exemplary embodiments, a semiconductor liner layer 151 may include a sidewall portion 151SP extending along a sidewall of a first source/drain recess 150R and a bottom portion 151BP extending along the bottom surface of the first source/drain recess 150R.

The sidewall portion 151SP of the semiconductor liner layer may include a pinning region 151_PIN. In the pinning region 151_PIN, a thickness of the sidewall portion 151SP of the semiconductor liner layer may decrease suddenly. In the pinning region 151_PIN, the thickness of the sidewall portion 151SP of the semiconductor liner layer may decrease and then may increase as it increases in distance from the first lower pattern BP1.

In a plan view, an inner sidewall 151_ISW of the semiconductor liner layer in the pinning region 151_PIN includes a portion recessed toward an outer sidewall 151_OSW of the semiconductor liner layer.

In a plan view, the inner sidewall 151_ISW of the semiconductor liner layer in the pinning region 151_PIN may be separated into two portions. For example, in the pinning region 151_PIN, the inner sidewall 151_ISW of the semiconductor liner layer may meet the outer sidewall 151_OSW of the semiconductor liner layer.

In some embodiments, unlike that illustrated in the drawings, in the pinning region 151_PIN, the inner sidewall 151_ISW of the semiconductor liner layer may be spaced apart from the outer sidewall 151_OSW of the semiconductor liner layer in the first direction D1.

On the basis of the upper surface BP1_US of the first lower pattern, the pinning region 151_PIN is illustrated as being formed at a height similar to a height of a saddle point SP of an upper semiconductor insertion layer 153, but the present disclosure is not limited thereto.

The pinning region 151_PIN is illustrated as being formed at a position overlapping a first gate electrode 120, which is between first sheet patterns NS1 in the first direction D1, but the present disclosure is not limited thereto.

It is illustrated in FIGS. 16 and 17 that one semiconductor liner layer 151 includes one pinning region 151_PIN, but the present disclosure is not limited thereto. Of course, one semiconductor liner layer 151 may include a plurality of pinning regions 151_PIN.

It is illustrated in FIGS. 16 and 17 that a portion of a first source/drain pattern 150 includes the pinning region 151_PIN and the remaining portion of the first source/drain pattern 150 does not include the pinning region 151_PIN, but the present disclosure is not limited thereto.

Figure 18:
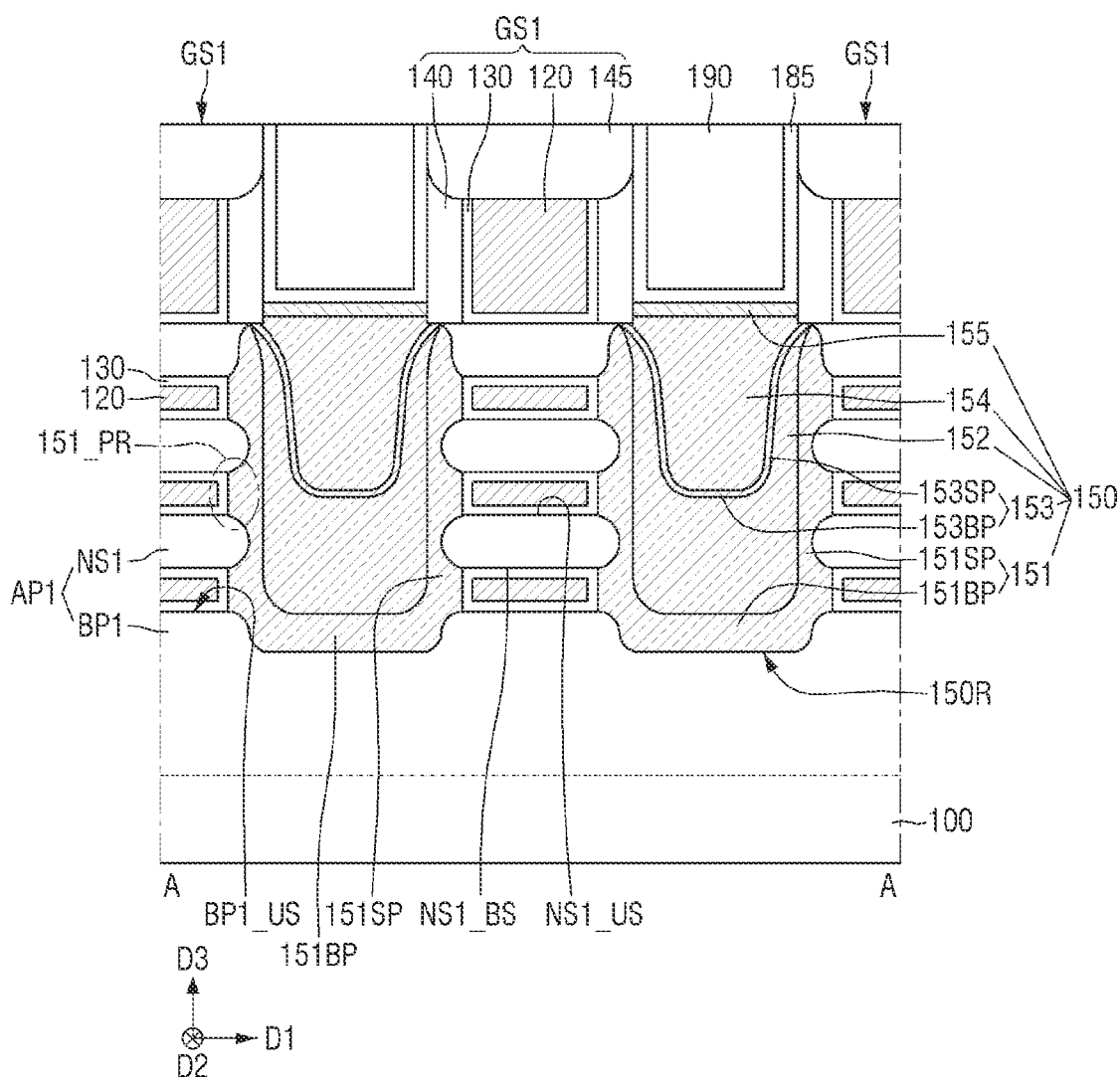
FIG. 18 is a view for describing a semiconductor device according to some exemplary embodiments.

FIG. 18 is a view for describing a semiconductor device according to some exemplary embodiments. For convenience of description, differences from those described with reference to FIGS. 1 to 12 will be mainly described.

Referring to FIG. 18, in the semiconductor device according to some exemplary embodiments, a sidewall of a first source/drain recess 150R may have an uneven shape.

A semiconductor liner layer 151 may include a sidewall portion 151SP extending along the sidewall of the first source/drain recess 150R and a bottom portion 151BP extending along a bottom surface of the first source/drain recess 150R.

The sidewall portion 151SP of the semiconductor liner layer may include a protruding region 151_PR. The protruding region 151_PR may be located in a region that overlaps a first gate electrode 120 in the first direction D1. The protruding region 151_PR may protrude in the first direction D1 toward the first gate electrode 120.

In other words, a portion of the semiconductor liner layer 151 may be recessed in the first direction D1 between first sheet patterns NS1 adjacent to each other in the third direction D3.

Figure 19:
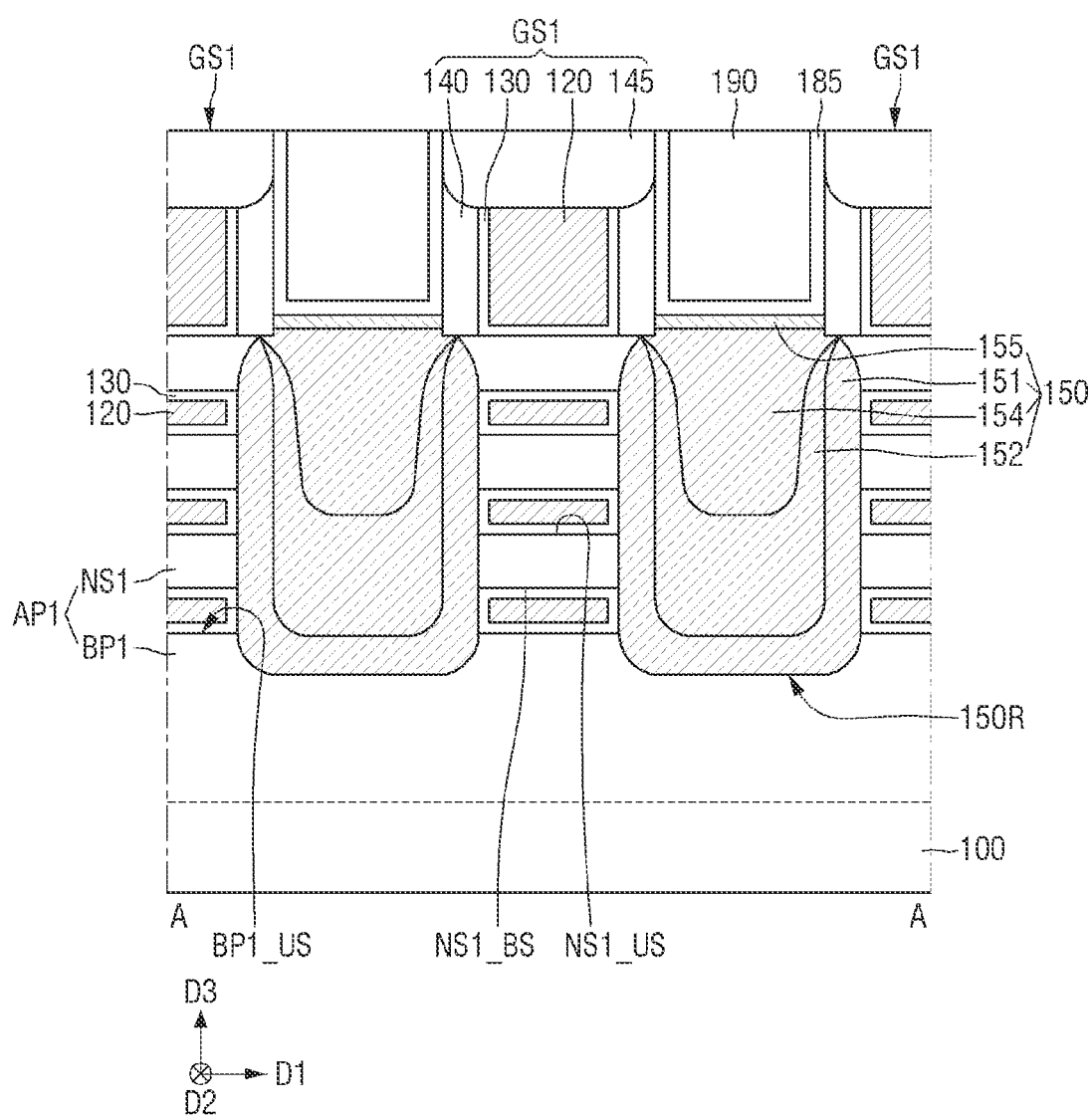
FIG. 19 is a view for describing a semiconductor device according to some exemplary embodiments.

FIG. 19 is a view for describing a semiconductor device according to some exemplary embodiments. For convenience of description, differences from those described with reference to FIGS. 1 to 12 will be mainly described.

Referring to FIG. 19, in the semiconductor device according to some exemplary embodiments, a first source/drain pattern 150 may not include an upper semiconductor insertion layer 153 between a lower semiconductor insertion layer 152 and a semiconductor filling layer 154.

The first source/drain pattern 150 includes a plurality of silicon-germanium layers on a first lower pattern BP1. As a distance from a first sheet pattern NS1 increases, a germanium fraction of the silicon-germanium layer increases. For example, a germanium fraction of the lower semiconductor insertion layer 152 may be greater than a germanium fraction of the semiconductor liner layer 151 and may be less than a germanium fraction of the semiconductor filling layer 154.

The lower semiconductor insertion layer 152 has a three-dimensional saddle structure.

Figure 20:
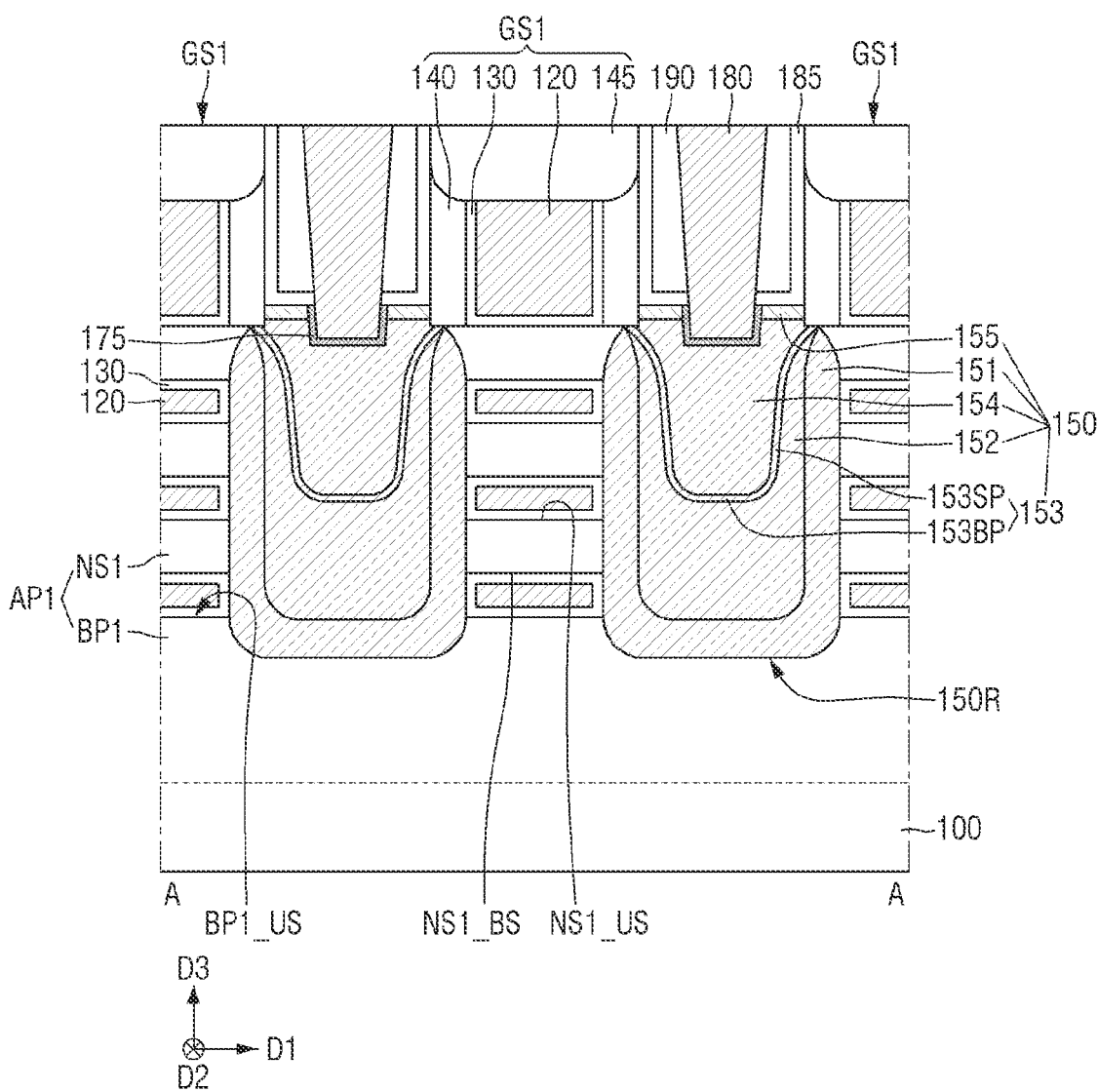
FIGS. 20 and 21 are views for describing a semiconductor device according to some exemplary embodiments.
Figure 21:
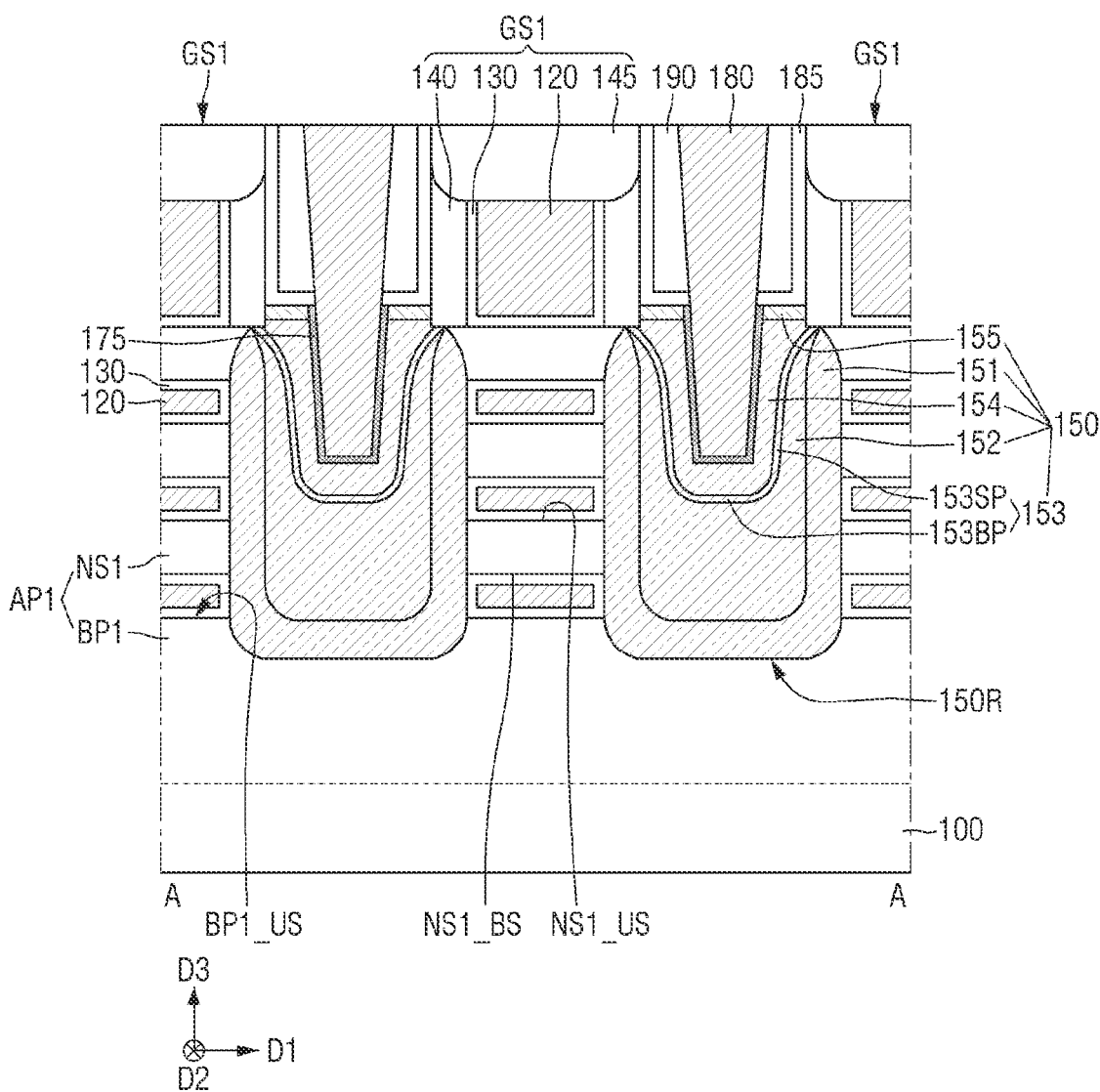

FIGS. 20 and 21 are views for describing a semiconductor device according to some exemplary embodiments. For convenience of description, differences from those described with reference to FIGS. 1 to 12 will be mainly described.

Referring to FIGS. 20 and 21, the semiconductor device according to some exemplary embodiments may further include a source/drain contact 180 on a first source/drain pattern 150.

The source/drain contact 180 may be connected to the first source/drain pattern 150. The source/drain contact 180 may be connected to the first source/drain pattern 150 through an interlayer insulating layer 190 and an etch stop layer 185.

A metal silicide layer 175 may be between the source/drain contact 180 and the first source/drain pattern 150.

In FIG. 20, a bottom surface of the source/drain contact 180 may be higher than a lower surface NS1_BS of a first sheet pattern NS1 at the uppermost portion of the first sheet pattern.

In FIG. 21, the bottom surface of the source/drain contact 180 may be located between the lower surface NS1_BS of the first sheet pattern at the lowermost portion of the first sheet pattern NS1 and the lower surface NS1_BS of the first sheet pattern at the uppermost portion of the first sheet pattern NS1.

The source/drain contact 180 is illustrated as being a single layer, but this is only for convenience of description, and the present disclosure is not limited thereto. The source/drain contact 180 may include, for example, at least one of a metal, a metal alloy, a conductive metal nitride, a conductive metal carbide, a conductive metal oxide, a conductive metal carbonitride, and a 2D material.

The metal silicide layer 175 may include a metal silicide.

Figure 22:
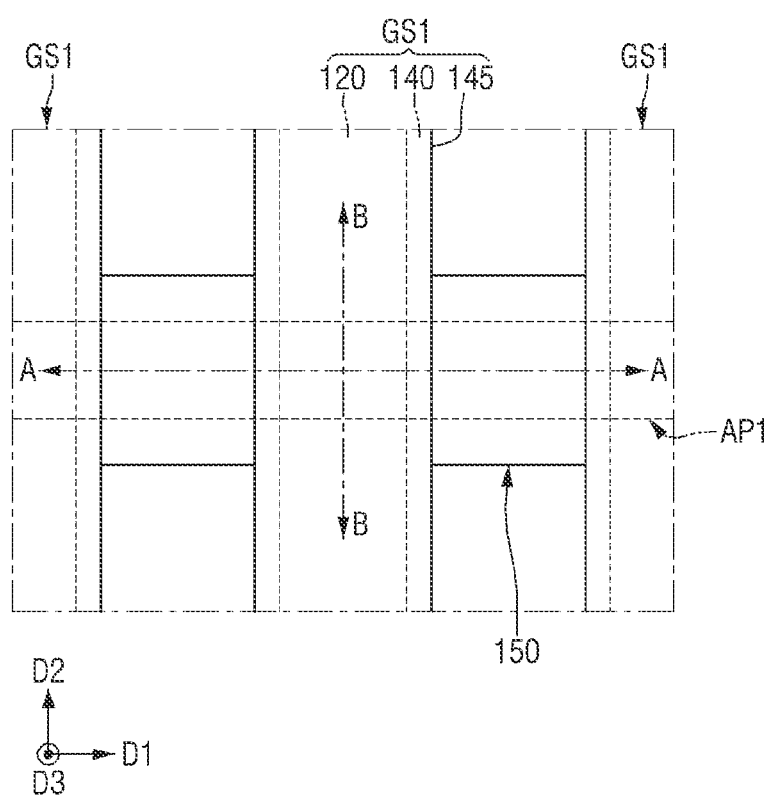
FIGS. 22 to 24 are views for describing a semiconductor device according to some exemplary embodiments.
Figure 23:
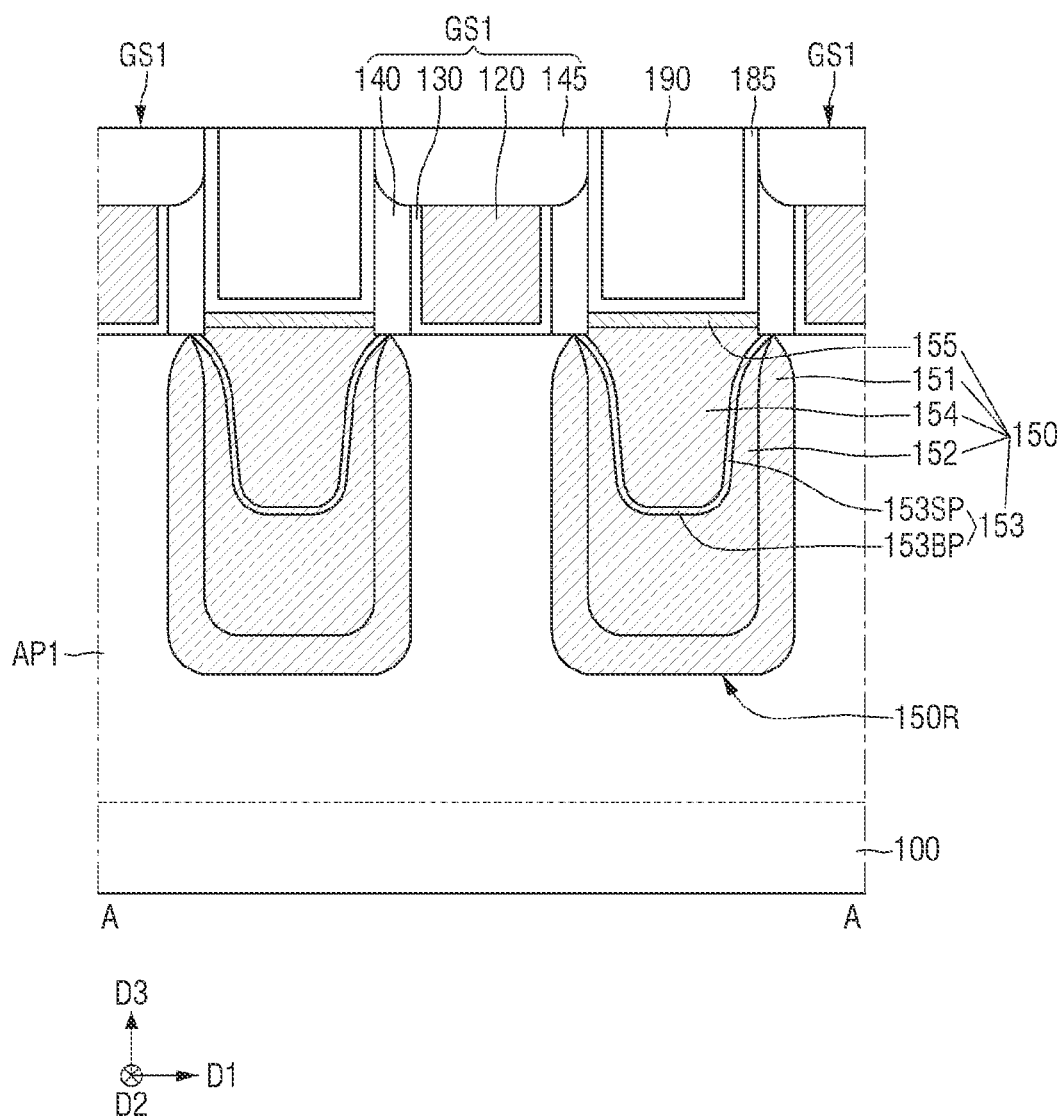
Figure 24:
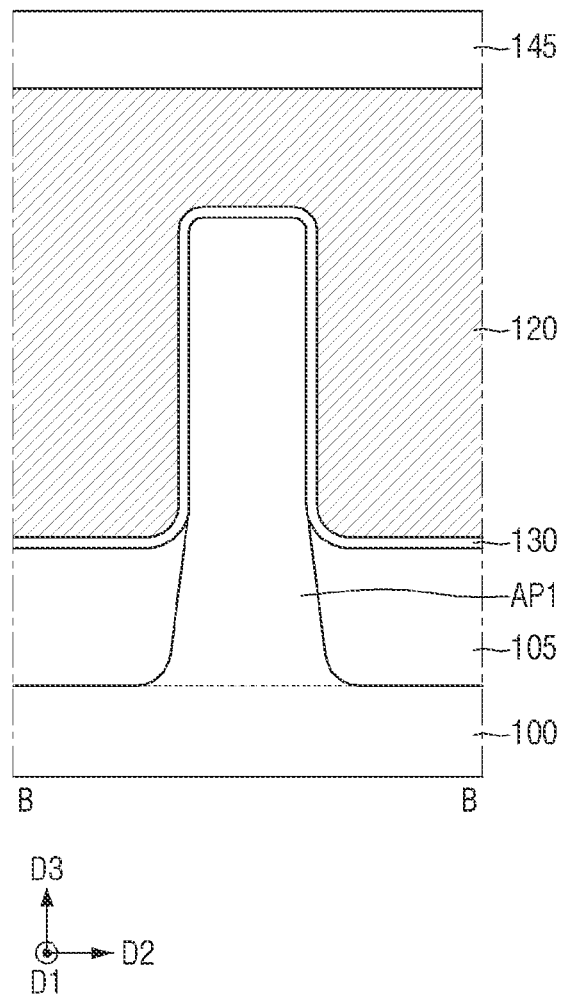

FIGS. 22 to 24 are views for describing a semiconductor device according to some exemplary embodiments. For convenience of description, differences from those described with reference to FIGS. 1 to 12 will be mainly described. For reference, FIGS. 23 and 24 may be cross-sectional views taken along lines A-A and B-B of FIG. 22, respectively.

Referring to FIGS. 22 to 24, in the semiconductor device according to some exemplary embodiments, a first active pattern AP1 may be a fin-type pattern elongated in the first direction D1.

A portion of the first active pattern AP1 protrudes further than an upper surface of a field insulating layer 105 in the third direction D3.

A first gate insulating layer 130 may extend along a profile of the first active pattern AP1 that protrudes further than the upper surface of the field insulating layer 105.

Figure 25:
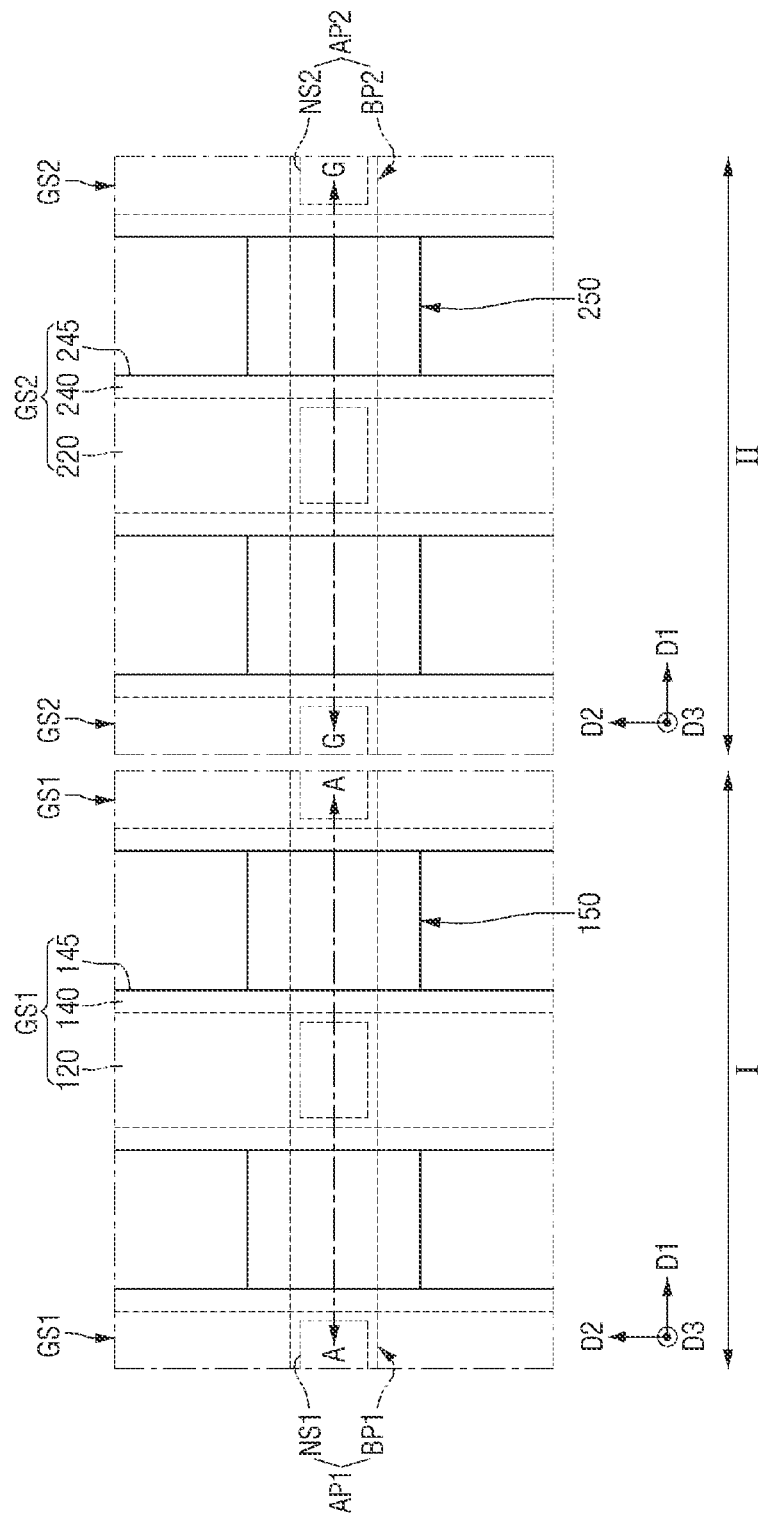
FIG. 25 is an exemplary plan view for describing a semiconductor device according to some exemplary embodiments.
Figure 26:
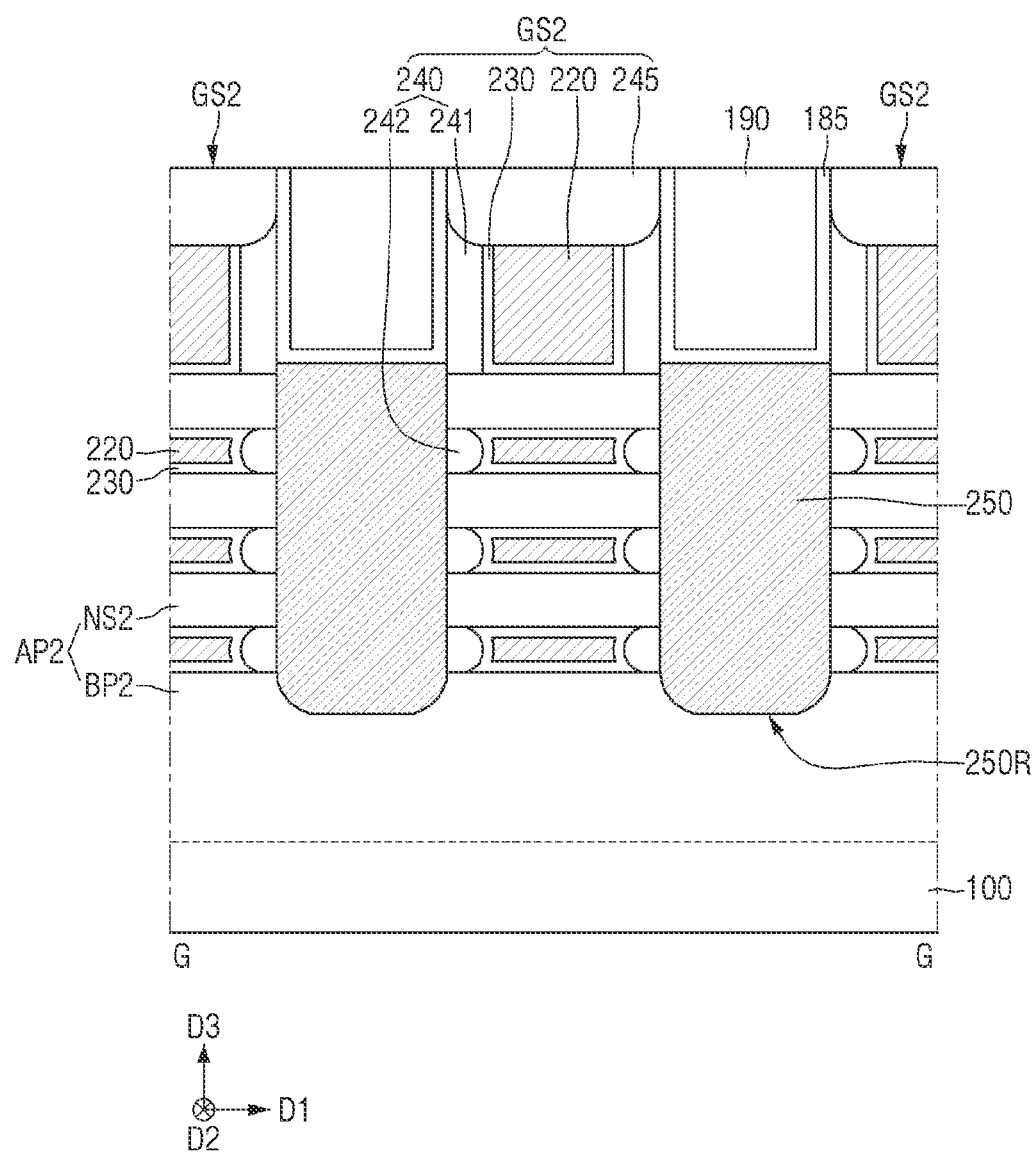
FIGS. 26 and 27 are cross-sectional views taken along line G-G of FIG. 25.
Figure 27:
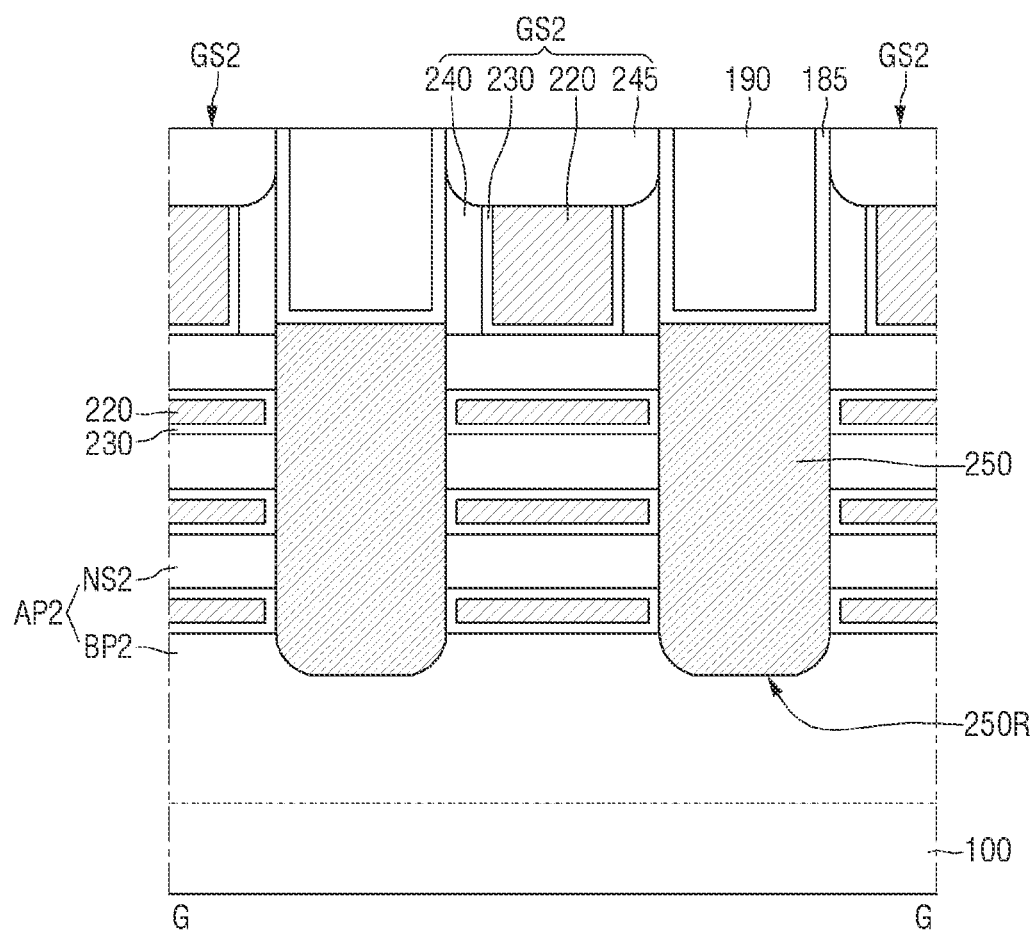

FIG. 25 is an exemplary plan view for describing a semiconductor device according to some exemplary embodiments. FIGS. 26 and 27 are cross-sectional views taken along line G-G of FIG. 25.

For reference, a cross-sectional view taken along line A-A of FIG. 25 may be the same as one of FIGS. 2, 15, 16, 18, and 19. In addition, a description of a first region I of FIG. 28 may be substantially the same as that described with reference to FIGS. 1 to 19. Thus, the following description will be made focusing on contents of a second region II of FIG. 25.

Referring to FIGS. 25 to 27, the semiconductor device according to some exemplary embodiments may include a first active pattern AP1, a plurality of first gate structures GS1, a first source/drain pattern 150, a second active pattern AP2, a plurality of second gate structures GS2, and a second source/drain pattern 250.

A substrate 100 may include the first region I and the second region II. The first region I may be a region in which a PMOS is formed, and the second region II may be a region in which an NMOS is formed.

The first active pattern AP1, the plurality of first gate structures GS1, and the first source/drain pattern 150 are arranged in the first region I of the substrate 100. The second active pattern AP2, the plurality of second gate structures GS2, and the second source/drain pattern 250 are arranged in the second region II of the substrate 100.

The second active pattern AP2 may include a second lower pattern BP2 and a plurality of second sheet patterns NS2. The second lower pattern BP2 may protrude from the substrate 100. The second lower pattern BP2 may be elongated in the first direction D1. The plurality of second sheet patterns NS2 may be arranged on the second lower pattern BP2. The plurality of second sheet patterns NS2 may be spaced apart from the second lower pattern BP2 in the third direction D3.

Each of the second lower patterns BP2 and the second sheet patterns NS2 may include one of silicon or germanium, which is an elemental semiconductor material, a group IV-IV compound semiconductor, or a group III-V compound semiconductor. In the semiconductor device according to some exemplary embodiments, the second lower pattern BP2 may be a silicon lower pattern including silicon, and the second sheet pattern NS2 may be a silicon sheet pattern including silicon.

When the first active pattern AP1 and the second active pattern AP2 are fin-type patterns, in an example, the first active pattern AP1 and the second active pattern AP2 may include the same semiconductor material. For example, the first active pattern AP1 and the second active pattern AP2 may each be a silicon fin-type pattern, but the present disclosure is not limited thereto. In some embodiments, the first active pattern AP1 and the second active pattern AP2 may include different semiconductor materials. For example, the first active pattern AP1 may be a silicon-germanium fin-type pattern, and the second active pattern AP2 may be a silicon fin-type pattern, but the present disclosure is not limited thereto.

The plurality of second gate structures GS2 may be arranged on the substrate 100. Each of the second gate structures GS2 may extend in the second direction D2. The adjacent second gate structures GS2 may be spaced apart from each other in the first direction D1.

The second gate structures GS2 may be arranged on the second active pattern AP2. The second gate structures GS2 may intersect the second active pattern AP2. The second gate structures GS2 may intersect the second lower pattern BP2. The second gate structures GS2 may surround the respective second sheet patterns NS2.

Each of the second gate structures GS2 may include, for example, a second gate electrode 220, a second gate insulating layer 230, a second gate spacer 240, and a second gate capping pattern 245.

In FIG. 26, the second gate spacer 240 may include an outer spacer 241 and an inner spacer 242, unlike the first gate spacer 140. The inner spacer 242 may be between the second sheet patterns NS2 adjacent to each other in the third direction D3. The inner spacer 242 may be in contact with the second gate insulating layer 230. The inner spacer 242 may define a portion of a second source/drain recess 250R.

In FIG. 27, the second gate spacer 240 does not include an inner spacer like the first gate spacer 140. That is, the second gate insulating layer 230 may be in contact with the second source/drain pattern 250.

Descriptions of the second gate electrode 220, the second gate insulating layer 230, the second gate spacer 240, and the second gate capping pattern 245 are substantially the same as those of the first gate electrode 120, the first gate insulating layer 130, the first gate spacer 140, and the first gate capping pattern 145, and thus will be omitted in the following description.

The second source/drain pattern 250 may be formed on the second active pattern AP2. The second source/drain pattern 250 may be formed on the second lower pattern BP2. The second source/drain pattern 250 may be connected to the second sheet pattern NS2.

The second source/drain pattern 250 may be on a side surface of the second gate structure GS2. The second source/drain pattern 250 may be between the second gate structures GS2 adjacent to each other in the first direction D1. For example, the second source/drain patterns 250 may be on both sides of the second gate structure GS2. In some embodiments, unlike that illustrated in the drawings, the second source/drain pattern 250 may be on one side of the second gate structure GS2 and may not be on the other side of the second gate structure GS2.

The second source/drain pattern 250 may be included in a source/drain of a transistor using the second sheet pattern NS2 as a channel region.

The second source/drain pattern 250 may be in the second source/drain recess 250R. A bottom surface of the second source/drain recess 250R may be defined by the second lower pattern BP2. A sidewall of the second source/drain recess 250R may be defined by the second sheet pattern NS2 and the second gate structure GS2.

The second source/drain pattern 250 may include silicon doped with n-type impurities. The n-type impurities may include, for example, phosphorus (P) or arsenic (As), but the present disclosure is not limited thereto.

When the second source/drain pattern 250 is in contact with the second gate insulating layer 230 as shown in FIG. 27, unlike that described above, the second source/drain pattern 250 may include a silicon-germanium liner extending along a profile of the second source/drain recess 250R. The second source/drain pattern 250 may include silicon doped with n-type impurities on the silicon-germanium liner.

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A semiconductor device comprising:
   a multi-channel active pattern;
   a plurality of gate structures on the multi-channel active pattern and spaced apart from each other in a first direction, the plurality of gate structures including a gate electrode extending in a second direction different from the first direction;
   a source/drain recess between an adjacent pair of the plurality of gate structures; and
   a source/drain pattern on the multi-channel active pattern in the source/drain recess,
   wherein the source/drain pattern includes:
   a semiconductor liner layer including silicon-germanium and extending along the source/drain recess,
   a semiconductor filling layer including silicon-germanium on the semiconductor liner layer, and at least one or more semiconductor insertion layers between the semiconductor liner layer and the semiconductor filling layer, and wherein the at least one or more semiconductor insertion layers have a three-dimensional saddle structure including a saddle point, a first saddle region on opposite sides of the saddle point in the second direction, and a second saddle region on opposite sides of the saddle point in the first direction.

2. The semiconductor device of claim 1, wherein:
the at least one or more semiconductor insertion layers include a lower semiconductor insertion layer, and an upper semiconductor insertion layer that is between the lower semiconductor insertion layer and the semiconductor filling layer,
the lower semiconductor insertion layer includes silicon-germanium,
a germanium fraction of the lower semiconductor insertion layer is greater than a germanium fraction of the semiconductor liner layer and a germanium fraction of the upper semiconductor insertion layer, and
a germanium fraction of the semiconductor filling layer is greater than the germanium fraction of the lower semiconductor insertion layer.

3. The semiconductor device of claim 2, wherein the upper semiconductor insertion layer includes silicon-germanium.

4. The semiconductor device of claim 1, wherein:
the at least one or more semiconductor insertion layers include silicon-germanium, and
a germanium fraction of the at least one or more semiconductor insertion layers is greater than a germanium fraction of the semiconductor liner layer and is less than a germanium fraction of the semiconductor filling layer.

5. The semiconductor device of claim 1, wherein:
the multi-channel active pattern includes a lower pattern, and a plurality of sheet patterns spaced apart from the lower pattern in a third direction that is perpendicular to the first direction and the second direction, and
the gate electrode surrounds the plurality of sheet patterns.

6. The semiconductor device of claim 1, wherein the multi-channel active pattern is a fin-type pattern.

7. A semiconductor device comprising:
an active pattern including a lower pattern extending in a first direction and a plurality of sheet patterns spaced apart from the lower pattern in a second direction perpendicular to the first direction;
a plurality of gate structures on the lower pattern to be spaced apart from each other in the first direction and including a gate electrode and a gate insulating layer, the gate electrode and the gate insulating layer surrounding the plurality of sheet patterns;
a source/drain recess between an adjacent pair of the plurality of gate structures; and
a source/drain pattern on the lower pattern in the source/drain recess and in contact with the sheet pattern,
wherein the source/drain pattern includes:
a semiconductor liner layer that extends along the source/drain recess, is in contact with the gate insulating layer, and includes silicon-germanium,
a first semiconductor insertion layer on the semiconductor liner layer,
a semiconductor filling layer including silicon-germanium on the first semiconductor insertion layer, and a semiconductor capping layer including silicon on the semiconductor filling layer, and wherein a germanium fraction of the first semiconductor insertion layer is less than a germanium fraction of the semiconductor liner layer and a germanium fraction of the semiconductor filling layer.

8. The semiconductor device of claim 7, further comprising a second semiconductor insertion layer between the first semiconductor insertion layer and the semiconductor liner layer and including silicon-germanium,
wherein a germanium fraction of the second semiconductor insertion layer is greater than the germanium fraction of the semiconductor liner layer and the germanium fraction of the first semiconductor insertion layer.

9. The semiconductor device of claim 7, wherein the first semiconductor insertion layer includes silicon-germanium.

10. The semiconductor device of claim 7, wherein:
the first semiconductor insertion layer includes a sidewall portion that extends along a sidewall of the source/drain recess and a bottom portion that extends along a bottom surface of the source/drain recess, and
when viewed in a cross-sectional view taken along the lower pattern, a thickness of the bottom portion of the first semiconductor insertion layer is less than a thickness of the sidewall portion of the first semiconductor insertion layer.

11. The semiconductor device of claim 7, wherein:
the first semiconductor insertion layer includes a sidewall portion that extends along a sidewall of the source/drain recess and a bottom portion that extends along a bottom surface of the source/drain recess, and
when viewed in a cross-sectional view taken along the lower pattern, a thickness of the bottom portion of the first semiconductor insertion layer is equal to a thickness of the sidewall portion of the first semiconductor insertion layer.

12. The semiconductor device of claim 7, wherein:
the semiconductor liner layer includes a sidewall portion that extends along a sidewall of the source/drain recess,
the sidewall portion of the semiconductor liner layer includes a pinning region, and
in the pinning region, a thickness of the semiconductor liner layer decreases and then increases as the semiconductor liner layer increases in distance from the lower pattern.

13. The semiconductor device of claim 7, wherein:
the semiconductor liner layer includes a sidewall portion that extends along a sidewall of the source/drain recess, and
the sidewall portion of the semiconductor liner layer includes a protruding region that protrudes toward the gate electrode, in a region that overlaps the gate electrode in the first direction.

14. The semiconductor device of claim 7, wherein the first semiconductor insertion layer has a three-dimensional saddle structure.

15. A semiconductor device comprising:
an active pattern including a lower pattern, and a sheet pattern spaced apart from the lower pattern in a first direction;
a gate structure on the lower pattern and including a gate electrode and a gate insulating layer that surrounds the sheet pattern, the gate electrode extending in a second direction perpendicular to the first direction; and
a source/drain pattern on the lower pattern and in contact with the gate insulating layer, wherein the source/drain pattern includes:
a semiconductor liner layer including an outer sidewall in contact with the gate insulating layer and an inner sidewall opposite to the outer sidewall,
a first semiconductor insertion layer in contact with the semiconductor liner layer on the inner sidewall of the semiconductor liner layer,
a second semiconductor insertion layer on the first semiconductor insertion layer, and
a semiconductor filling layer on the second semiconductor insertion layer, and
wherein the first semiconductor insertion layer covers at least a portion of the inner sidewall of the semiconductor liner layer,
the second semiconductor insertion layer extends along at least a portion of a profile of the first semiconductor insertion layer,
a germanium fraction of the first semiconductor insertion layer is greater than a germanium fraction of the semiconductor liner layer and is less than a germanium fraction of the semiconductor filling layer, and
a germanium fraction of the second semiconductor insertion layer is less than the germanium fraction of the semiconductor liner layer and the germanium fraction of the first semiconductor insertion layer.

16. The semiconductor device of claim 15, wherein the first semiconductor insertion layer, the second semiconductor insertion layer, and the semiconductor filling layer are sequentially stacked on the inner sidewall of the semiconductor liner layer in a third direction, and
wherein the third direction is perpendicular to the first direction and the second direction.

17. The semiconductor device of claim 16, wherein, when viewed in a plan view, the first semiconductor insertion layer extends along a portion of the inner sidewall of the semiconductor liner layer.

18. The semiconductor device of claim 15, wherein:
the first semiconductor insertion layer extends in a third direction from the inner sidewall of the semiconductor liner layer,
the third direction is perpendicular to the first direction and the second direction, and
when viewed in a plan view, the first semiconductor insertion layer separates the semiconductor filling layer into two portions.

19. The semiconductor device of claim 18, wherein the second semiconductor insertion layer extends along at least a portion of a boundary between the first semiconductor insertion layer and the semiconductor filling layer.

20. The semiconductor device of claim 15, wherein
the gate structure includes a gate spacer extending in the second direction along a sidewall of the gate electrode,
the gate spacer includes a first sidewall extending in the second direction and a second sidewall extending in a third direction perpendicular to the first direction and the second direction,
a portion of the source/drain pattern is in contact with the second sidewall of the gate spacer,
the inner sidewall of the semiconductor liner layer includes a facet portion extending from the second sidewall of the gate spacer, and
the second semiconductor insertion layer is in contact with the second sidewall of the gate spacer and covers the facet portion of the inner sidewall of the semiconductor liner layer.

* * * * *